United States Patent
Demaray et al.

(10) Patent No.: US 8,076,005 B2
(45) Date of Patent: Dec. 13, 2011

(54) ENERGY CONVERSION AND STORAGE FILMS AND DEVICES BY PHYSICAL VAPOR DEPOSITION OF TITANIUM AND TITANIUM OXIDES AND SUB-OXIDES

(75) Inventors: Richard E. Demaray, Portola Valley, CA (US); Hong Mei Zhang, San Jose, CA (US); Mukundan Narasimhan, San Jose, CA (US); Vassiliki Milonopoulou, San Jose, CA (US)

(73) Assignee: SpringWorks, LLC, Minnetonka, MN (US)

( * ) Notice: Subject to any disclaimer, the term of this patent is extended or adjusted under 35 U.S.C. 154(b) by 844 days.

(21) Appl. No.: 11/726,972

(22) Filed: Mar. 22, 2007

(65) Prior Publication Data

US 2007/0172681 A1    Jul. 26, 2007

Related U.S. Application Data

(62) Division of application No. 10/851,542, filed on May 20, 2004, now Pat. No. 7,238,628.

(60) Provisional application No. 60/473,375, filed on May 23, 2003.

(51) Int. Cl.
*B32B 9/00* (2006.01)
*B32B 15/04* (2006.01)

(52) U.S. Cl. ......... 428/469; 428/472; 428/701; 428/702

(58) Field of Classification Search .................. 428/469, 428/472, 701, 702
See application file for complete search history.

(56) References Cited

U.S. PATENT DOCUMENTS

| | | | |
|---|---|---|---|
| 3,309,302 A | 3/1967 | Heil | |
| 3,616,403 A | 10/1971 | Collins et al. | |
| 3,850,604 A | 11/1974 | Klein | |
| 4,006,070 A | 2/1977 | King et al. | |
| 4,082,569 A | 4/1978 | Evans, Jr. | |
| 4,099,091 A * | 7/1978 | Yamazoe et al. | 313/509 |

(Continued)

FOREIGN PATENT DOCUMENTS

EP    0 639 655 A1    2/1995

(Continued)

OTHER PUBLICATIONS

Affinito, J.D. et al., "PML/oxide/PML Barrier Layer Performance Differences Arising from Use of UV or Electron Beam Polymerization of the PML Layers," Thin Solid Films 308-309:19-25 (Oct. 31, 1997).

(Continued)

*Primary Examiner* — Angel Roman
(74) *Attorney, Agent, or Firm* — Haynes and Boone, LLP

(57) ABSTRACT

High density oxide films are deposited by a pulsed-DC, biased, reactive sputtering process from a titanium containing target to form high quality titanium containing oxide films. A method of forming a titanium based layer or film according to the present invention includes depositing a layer of titanium containing oxide by pulsed-DC, biased reactive sputtering process on a substrate. In some embodiments, the layer is $TiO_2$. In some embodiments, the layer is a sub-oxide of Titanium. In some embodiments, the layer is $Ti_xO_y$, wherein x is between about 1 and about 4 and y is between about 1 and about 7. In some embodiments, the layer can be doped with one or more rare-earth ions. Such layers are useful in energy and charge storage, and energy conversion technologies.

36 Claims, 15 Drawing Sheets

U.S. PATENT DOCUMENTS

| | | |
|---|---|---|
| 4,111,523 A | 9/1978 | Kaminow et al. |
| 4,437,966 A | 3/1984 | Hope et al. |
| 4,587,225 A | 5/1986 | Tsukuma et al. |
| RE32,449 E | 6/1987 | Claussen |
| 4,915,810 A | 4/1990 | Kestigian et al. |
| 4,978,437 A | 12/1990 | Wirz |
| 5,085,904 A | 2/1992 | Deak et al. |
| 5,110,696 A | 5/1992 | Shokoohi et al. |
| 5,119,460 A | 6/1992 | Bruce et al. |
| 5,173,271 A | 12/1992 | Chen et al. |
| 5,174,876 A | 12/1992 | Buchal et al. |
| 5,200,029 A | 4/1993 | Bruce et al. |
| 5,225,288 A | 7/1993 | Beeson et al. |
| 5,237,439 A | 8/1993 | Misono et al. |
| 5,296,089 A | 3/1994 | Chen et al. |
| 5,338,625 A | 8/1994 | Bates et al. |
| 5,355,089 A | 10/1994 | Treger |
| 5,362,672 A | 11/1994 | Ohmi et al. |
| 5,427,669 A | 6/1995 | Drummond |
| 5,435,826 A | 7/1995 | Sakakibara et al. |
| 5,457,569 A | 10/1995 | Liou et al. |
| 5,472,795 A | 12/1995 | Atita |
| 5,478,456 A | 12/1995 | Humpal et al. |
| 5,499,207 A | 3/1996 | Miki et al. |
| 5,507,930 A | 4/1996 | Yamashita et al. |
| 5,512,147 A | 4/1996 | Bates et al. |
| 5,538,796 A | 7/1996 | Schaffer et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,569,520 A | 10/1996 | Bates |
| 5,591,520 A | 1/1997 | Migliorini et al. |
| 5,597,660 A | 1/1997 | Bates et al. |
| 5,607,560 A | 3/1997 | Hirabayashi et al. |
| 5,607,789 A | 3/1997 | Treger et al. |
| 5,612,152 A | 3/1997 | Bates |
| 5,654,054 A | 8/1997 | Tropsha et al. |
| 5,654,984 A | 8/1997 | Hershbarger et al. |
| 5,660,700 A | 8/1997 | Shimizu et al. |
| 5,681,671 A | 10/1997 | Orita et al. |
| 5,686,360 A | 11/1997 | Harvey, III et al. |
| 5,693,956 A | 12/1997 | Shi et al. |
| 5,702,829 A | 12/1997 | Paidassi et al. |
| 5,718,813 A | 2/1998 | Drummond |
| 5,731,661 A | 3/1998 | So et al. |
| 5,738,731 A | 4/1998 | Shindo et al. |
| 5,755,938 A | 5/1998 | Fukui et al. |
| 5,757,126 A | 5/1998 | Harvey, III et al. |
| 5,771,562 A | 6/1998 | Harvey, III et al. |
| 5,789,071 A | 8/1998 | Sproul et al. |
| 5,792,550 A | 8/1998 | Phillips et al. |
| 5,811,177 A | 9/1998 | Shi et al. |
| 5,814,195 A | 9/1998 | Lehan et al. |
| 5,830,330 A | 11/1998 | Lantsman |
| 5,841,931 A | 11/1998 | Foresi et al. |
| 5,849,163 A | 12/1998 | Ichikawa et al. |
| 5,853,830 A | 12/1998 | McCaulley et al. |
| 5,855,744 A | 1/1999 | Halsey et al. |
| 5,870,273 A | 2/1999 | Sogabe et al. |
| 5,882,946 A | 3/1999 | Otani |
| 5,909,346 A | 6/1999 | Malhotra et al. |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsman |
| 5,952,778 A | 9/1999 | Haskal et al. |
| 5,977,582 A | 11/1999 | Fleming et al. |
| 6,001,224 A | 12/1999 | Drummond et al. |
| 6,004,660 A | 12/1999 | Topolski et al. |
| 6,024,844 A | 2/2000 | Drummond et al. |
| 6,045,626 A | 4/2000 | Yano et al. |
| 6,046,081 A | 4/2000 | Kuo |
| 6,051,114 A | 4/2000 | Yao et al. |
| 6,051,296 A | 4/2000 | McCaulley et al. |
| 6,057,557 A | 5/2000 | Ichikawa |
| 6,093,944 A | 7/2000 | VanDover |
| 6,106,933 A | 8/2000 | Nagai et al. |
| 6,117,279 A | 9/2000 | Smolanoff et al. |
| 6,146,225 A | 11/2000 | Sheats et al. |
| 6,162,709 A | 12/2000 | Raoux et al. |
| 6,165,566 A | 12/2000 | Tropsha |
| 6,168,884 B1 | 1/2001 | Neudecker et al. |
| 6,176,986 B1 | 1/2001 | Watanabe et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,214,660 B1 | 4/2001 | Uemoto et al. |
| 6,232,242 B1 | 5/2001 | Hata et al. |
| 6,242,129 B1 | 6/2001 | Johnson |
| 6,242,132 B1 | 6/2001 | Neudecker et al. |
| 6,248,640 B1 | 6/2001 | Nam |
| 6,261,917 B1 | 7/2001 | Quek et al. |
| 6,268,695 B1 | 7/2001 | Affinito |
| 6,280,585 B1 | 8/2001 | Obinata et al. |
| 6,280,875 B1 | 8/2001 | Kwak et al. |
| 6,281,142 B1 | 8/2001 | Basceri et al. |
| 6,287,986 B1 | 9/2001 | Mihara |
| 6,290,821 B1 | 9/2001 | McLeod |
| 6,290,822 B1 | 9/2001 | Fleming et al. |
| 6,300,215 B1 | 10/2001 | Shin |
| 6,306,265 B1 | 10/2001 | Fu et al. |
| 6,344,419 B1 | 2/2002 | Forster et al. |
| 6,350,353 B2 | 2/2002 | Gopalraja et al. |
| 6,358,810 B1 | 3/2002 | Dornfest et al. |
| 6,361,662 B1 | 3/2002 | Chiba et al. |
| 6,365,300 B1 | 4/2002 | Ota et al. |
| 6,365,319 B1 | 4/2002 | Heath et al. |
| 6,372,098 B1 | 4/2002 | Newcomb et al. |
| 6,376,027 B1 | 4/2002 | Lee et al. |
| 6,379,835 B1 | 4/2002 | Kucherovsky et al. |
| 6,391,166 B1 | 5/2002 | Wang |
| 6,413,382 B1 | 7/2002 | Wang et al. |
| 6,413,645 B1 | 7/2002 | Graff et al. |
| 6,423,776 B1 | 7/2002 | Akkapeddi et al. |
| 6,433,380 B2 | 8/2002 | Shin |
| 6,444,750 B1 | 9/2002 | Touhsaent |
| 6,488,822 B1 | 12/2002 | Moslehi |
| 6,497,598 B2 | 12/2002 | Affinito |
| 6,522,067 B1 | 2/2003 | Graff et al. |
| 6,533,907 B2 | 3/2003 | Demaray et al. |
| 6,558,836 B1 | 5/2003 | Whitacre et al. |
| 6,570,325 B2 | 5/2003 | Graff et al. |
| 6,576,546 B2 | 6/2003 | Gilbert et al. |
| 6,632,563 B1 | 10/2003 | Krasnov et al. |
| 6,641,704 B2 | 11/2003 | Someno |
| 6,673,716 B1 | 1/2004 | D'Couto et al. |
| 6,683,244 B2 | 1/2004 | Fujimori et al. |
| 6,750,156 B2 | 6/2004 | Le et al. |
| 6,764,525 B1 | 7/2004 | Whitacre et al. |
| 6,818,356 B1 | 11/2004 | Bates |
| 6,846,765 B2 | 1/2005 | Imamura et al. |
| 6,849,165 B2 | 2/2005 | Kloppel et al. |
| 7,262,131 B2 | 8/2007 | Narasimhan et al. |
| 7,378,356 B2 | 5/2008 | Zhang et al. |
| 7,381,657 B2 | 6/2008 | Zhang et al. |
| 7,404,877 B2 | 7/2008 | Demaray et al. |
| 7,413,998 B2 | 8/2008 | Zhang et al. |
| 7,544,276 B2 | 6/2009 | Zhang et al. |
| 7,838,133 B2 | 11/2010 | Zhang et al. |
| 2001/0034106 A1 | 10/2001 | Moise et al. |
| 2001/0041460 A1 | 11/2001 | Wiggins |
| 2001/0050223 A1 | 12/2001 | Gopalraja et al. |
| 2002/0001746 A1 | 1/2002 | Jenson |
| 2002/0009630 A1 | 1/2002 | Gao et al. |
| 2002/0115252 A1 | 8/2002 | Haukka et al. |
| 2002/0140103 A1 | 10/2002 | Kloster et al. |
| 2003/0022487 A1 | 1/2003 | Yoon et al. |
| 2003/0035906 A1 | 2/2003 | Memarian et al. |
| 2003/0042131 A1 | 3/2003 | Johnson |
| 2003/0077914 A1 | 4/2003 | Le et al. |
| 2003/0079838 A1 | 5/2003 | Brcka |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0173207 A1 | 9/2003 | Zhang et al. |

| | | |
|---|---|---|
| 2003/0178637 A1 | 9/2003 | Chen et al. |
| 2003/0234835 A1 | 12/2003 | Torii et al. |
| 2004/0043557 A1 | 3/2004 | Haukka et al. |
| 2004/0077161 A1 | 4/2004 | Chen et al. |
| 2004/0105644 A1 | 6/2004 | Dawes |
| 2004/0245561 A1 | 12/2004 | Sakashita et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0071592 A1 | 4/2006 | Narasimhan et al. |
| 2006/0134522 A1 | 6/2006 | Zhang et al. |
| 2007/0053139 A1 | 3/2007 | Zhang et al. |
| 2007/0172681 A1 | 7/2007 | Demaray et al. |

FOREIGN PATENT DOCUMENTS

| | | |
|---|---|---|
| EP | 0 652 308 A2 | 5/1995 |
| EP | 0 652 308 A3 | 5/1995 |
| EP | 0 820 088 A2 | 1/1998 |
| EP | 0 820 088 A3 | 1/1998 |
| EP | 0 867 985 B1 | 9/1998 |
| EP | 1 092 689 A1 | 4/2001 |
| JP | 61-60803 | 3/1986 |
| JP | 62-287071 | 12/1987 |
| JP | 2-054764 A2 | 2/1990 |
| JP | 6-010127 | 1/1994 |
| JP | 9-249962 | 9/1997 |
| KR | 2003-0088236 | 11/2003 |
| WO | WO 00/36665 A1 | 6/2000 |
| WO | WO 01/82297 A1 | 11/2001 |
| WO | WO 01/86731 | 11/2001 |
| WO | WO 02/12932 A2 | 2/2002 |
| WO | WO 02/12932 A3 | 2/2002 |
| WO | WO 2004/077519 A2 | 9/2004 |
| WO | WO 2004/077519 A3 | 9/2004 |
| WO | WO 2004/106581 A2 | 12/2004 |
| WO | WO 2004/106582 A2 | 12/2004 |
| WO | WO 2006/063308 A2 | 6/2006 |
| WO | WO 2007/027535 | 3/2007 |

OTHER PUBLICATIONS

Affinito, J.D. et al., "Polymer-Oxide Transparent Barrier Layers," Society of Vacuum Coaters, 39th Ann. Technical Conference Proceedings, May 5-10, 1996, Philadelphia, PA, pp. 392-397 (May 5-10, 1996).

Barbier, D., "Performances and potential applications of erbium doped planar waveguide amplifiers and lasers," Proc. OAA, Victoria, BC, Canada, pp. 58-63 (Jul. 21-23, 1997).

Belkind, A. et al., "Pulsed-DC Reactive Sputtering of Dielectrics: Pulsing Parameter Effects," 43rd Annual Technical Conference Proceedings-Denver: 86-90 (Apr. 15-20, 2000).

Belkind, A. et al., "Using pulsed direct current power for reactive sputtering of Al2O3," J. Vac. Sci. Technol. A 17(4):1934-1940 (Jan. 18, 1999).

Campbell, S.A. et al., "Titanium dioxide (TiO2)-based gate insulators," IBM J. Res. Develop. 43(3):383-392 (May 1999).

Chang, C.Y. & Sze, S.M. (Eds.), in: ULSI Technology, The McGraw-Hill Companies, Inc., New York, Chapter 4, pp. 169-170, & 226-231 (1996).

Chen, G. et al. "Development of Supported Bifunctional Electrocatalysts for Unitized Regenerative Fuel Cells," J. Electrochemical Society 149(8):A1092-A1099 (Jul. 2, 2002).

Crowder, M.A. et al., "Low-Temperature Single-Crystal Si TFT's Fabricated on Si Films Processed via Sequential Lateral Solidification," IEEE Electron Device Lett. 19(8):306-308 (Aug. 1998).

Delavaux, J-M. et al., "Integrated optics erbium ytterbium amplifier system in 10Gb/s fiber transmission experiment," 22nd European Conference on Optical Communication, Oslo, I.123-I.126 (Sep. 15-19, 1996).

Distributed Energy Resources: Fuel Cells, Projects, 4 pages http://www.eere.energy.gov/der/fuel_cells/projects.html (May 23, 2003).

Dorey, R.A., "Low temperature micromoulding of functional ceramic devices," Grant summary for GR/S84156/01 for the UK Engineering and Physical Sciences Research Council, 2 pages (Oct. 2004).

DuPont Teijin Films, Mylar 200 SBL 300, Product Information, 4 pages (2000).

E-Tek website: FAQ, Inside E-Tek, E-Tek News, Products; http://www.etek-inc.com/, 10 pages (May 23, 2003).

Fujii, M. et al., "1.54 μm photoluminescence of Er3+ doped into SiO2 films containing Si nanocrystals: Evidence for energy transfer from Si nanocrystals for Er3+," Appl. Phys. Lett. 71(9):1198-1200 (Sep. 1, 1997).

Goossens, A. et al., "Sensitization of TiO2 with p-type semiconductor polymers," Chem. Phys. Lett. 287:148 (1998).

Greene, J.E. et al., "Morphological and electrical properties of rf sputtered Y2O3-doped ZrO2 thin films,"J. Vac. Sci. Tech. 13(1):72-75 (Jan./Feb. 1976).

Han, H.-S. et al. "Optical Gain at 1.54 μm in Erbium-Doped Silicon Nanocluster Sensitized Waveguide," Appl. Phys. Lett. 79(27):4568-4570 (Dec. 31, 2001).

Hayfield, P.C.S., in: Development of a New Material-Monolithic Ti4O7 Ebonix® Ceramic, Royal Society of Chemistry, Cambridge, UK, Table of Contents, 4 pages (2002).

Howson, R.P., "The reactive sputtering of oxides and nitrides," Pure & Appl. Chem. 66(6):1311-1318 (1994).

Hwang, M-S. et al., "The effect of pulsed magnetron sputtering on the properties of indium tin oxide thin films," Surface and Coatings Tech. 171:29-33 (2003).

Im, J.S. et al. "Controlled Super-Lateral Growth of Si Films for Microstructural Manipulation and Optimization," Physica Status Solidi (A) 166(2):603-617 (Feb. 23, 1998).

Im, J.S. & Sposili, R.S., "Crystalline Si Films for Integrated Active-Matrix Liquid Crystal Displays," MRS Bulletin, pp. 39-48 (Mar. 1996).

Im, J.S. et al., "Single-crystal Si films for thin-film transistor devices," Appl. Physics Lett. 70(25):3434-3436 (Jun. 23, 1997).

Jackson, M.K. & Movassaghi, M., "An Accurate Compact EDFA Model," Eur. Conf. Optical Comm., Munich, Germany, 2 pages (2000).

Janssen, R. et al. "Photoinduced electron transfer from conjugated polymers onto nanocrystalline TiO2," Synthet. Metal., 1 page (1999).

Jonsson L.B. et al. "Frequency response in pulsed DC reactive sputtering processes," Thin Solid Films 365:43-48 (2000).

Kelly, P.J. et al., "Reactive pulsed magnetron sputtering process for alumina films," J. Vac. Sci. Technol. A 18(6):2890-2896 (2000).

Kelly, P.J. & Arnell, R.D., "Control of the structure & properties of aluminum oxide coatings deposited by pulsed magnetron sputtering," J. Vac. Sci. Technol. A 17(3):945-953 (1999).

Kelly, P.J. et al., "A novel technique for the deposition of aluminum-doped zinc oxide films," Thin Solid Films 426(1-2):111-116 (2003).

Kik, P.G. & Polman, A., "Gain Limiting Processes in Er-doped Si Nanocrystal Waveguides in SiO2," J. Appl. Phys. 91(1):534-536 (2002).

Kim, H-K. & Yoon, Y., "Characteristics of rapid-thermal-annealed LiCoO2 cathode film for an all-solid-state thin film microbattery," J. Vac. Sci. Technol. A 22(4):1182-1187 (2004).

Kim, J-Y. et al. "Frequency-dependent pulsed direct current magnetron sputtering of titanium oxide films," J. Vac. Sci. Technol. A 19(2):429-434 (2001).

Lamb, W.B., "Designing Nonfoil Containing Skins for VIP Applications," DuPont VIA Symposium Presentation, 35 pages (1999).

Lamb, W. & Zeiler, R., "Designing Non-Foil Containing Skins for Vacuum Insulation Panel (VIP) Applications," Vuoto XXVIII(1-2):55-58 (1999).

Lange, M.R. et al., "High Gain Ultra-Short Length Phosphate glass Erbium-Doped Fiber Amplifier Material," OSA Optical Fiber Communications (OFC), 3 pages (2002).

Laporta, P. et al., "Diode-pumped cw bulk Er:Yb:glass laser," Optics Letters 16(24):1952-1954 (1991).

Lee, B.H. et al., "Effects of interfacial layer growth on the electrical characteristics of thin titanium oxide films on silicon," Appl. Phys. Lett. 74(21):3143-3145 (1999).

Mardare, D. & Rusu, G.I., "On the structure of Titanium Oxide Thin Films," Analele Stiintifice Ale Universitatii IASI, Romania, pp. 201-208 (1999).

Mizuno, Y. et al. "Temperature dependence of oxide decomposition on titanium surfaces in UHV," J. Vac. Sci. & Tech. A 20(5):1716-1721 (2002).

Ohkubo, H. et al., "Polarization-Insensitive Arrayed-Waveguide Grating Using Pure SiO2 Cladding," Fifth Optoelectronics and Communication Conference (OECC 2000) Technical Digest, pp. 366-367 (2000).

Ohmi, S. et al., "Rare earth metal oxides for high-K gate insulator," VLSI Design 2004, 1 page (2004).

Ohtsuki, T. et al., "Gain Characteristics of a high concentration Er3+-doped phosphate glass waveguide," J. Appl. Phys. 78(6):3617-3621 (1995).

Padmini, P. et al. "Realization of High Tunability Barium Strontium Titanate Thin Films by rf Magnetron Sputtering," Appl. Phys. Lett. 75(20):3186-3188 (1999).

Pan, T. et al., "Planar Er3+-doped aluminosilicate waveguide amplifier with more than 10 dB gain across C-band," Optical Society of America, 3 pages (2000).

Peters, D.P. et al., "Formation mechanism of silver nanocrystals made by ion irradiation of Na+ ↔ Ag+ ion-exchanged sodalime silicate glass," Nuclear Instruments and Methods in Physics Research B 168:237-244 (2000).

Roberts, S.W. et al., "The Photoluminescence of Erbium-doped Silicon Monoxide," University of Southampton, Department of Electronics and Computer Science Research Journal, 7 pages (1996).

Sanyo Vacuum Industries Co., Ltd. Products Info, TiO2, (2003), 1 page http://www.sanyovac.co.jp/Englishweb/products/ETiO2.htm.

Schermer, R. et al., "Investigation of Mesa Dielectric Waveguides," Proceedings of the OSA Integrated Photonics Research Topical Meeting and Exhibit, Paper No. IWB3, 3 pages (2001).

Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).

Scholl, R., "Power Supplies for Pulsed Plasma Technologies: State-Of-The-Art and Outlook," Advances Energy Industries, Inc., pp. 1-8 (1999).

Scholl, R., "Power Systems for Reactive Sputtering of Insulating Films," Advances Energy Industries, Inc., pp. 1-8 (Aug. 2001).

Second International Symposium of Polymer Surface Modification: Relevance to Adhesion, Preliminary Program, 13 pages (1999).

Seventh International Conference on TiO2 Photocatalysis: Fundamentals & Applications, Toronto, Ontario, Canada, Final Program, 7 pages (Nov. 17-21, 2002).

Shaw, D.G. et al., "Use of Vapor Deposited Acrylate Coatings to Improve the Barrier Properties of Metallized Film," Society of Vacuum Coaters, 37th Annual Technical Conference Proceedings, pp. 240-244 (1994).

Shin, J.C. et al. "Dielectric and Electrical Properties of Sputter Grown (Ba,Sr)TiO3 Thin Films," J. Appl. Phys. 86(1):506-513 (1999).

Shmulovich, J. et al., "Recent progress in Erbium-doped waveguide amplifiers," Bell Laboratories, pp. 35-37 (1999).

Slooff, L.H. et al., "Optical properties of Erbium-doped organic polydentate cage complexes," J. Appl. Phys. 83(1):497-503 (1998).

Snoeks, E. et al., "Cooperative upconversion in erbium-implanted soda-lime silicate glass optical waveguides," J. Opt. Soc. Am. B 12(8):1468-1474 (1995).

Strohhofer, C. & Polman, A. "Energy transfer to Er3+ in Ag ion-exchanged glass," FOM Institute for Atomic & Molecular Physics, 10 pages (2001).

Sugiyama, A. et al., "Gas Permeation Through the Pinholes of Plastic Film Laminated with Aluminium Foil," Vuoto XXVIII(1-2):51-54 (1999).

Ting, C.Y. et al., "Study of planarized sputter-deposited SiO2," J. Vac. Sci. Technol. 15(3):1105-1112 (1978).

Treichel, O. & Kirchhoff, V., "The influence of pulsed magnetron sputtering on topography & crystallinity of TiO2 films on glass," Surface & Coatings Technology 123:268-272 (2000).

Tukamoto, H. & West, A.R., "Electronic Conductivity of LiCoOs & Its Enhancement by Magnesium Doping," J. Electrochem. Soc. 144(9):3164-3168 (1997).

Van Dover, R.B., "Amorphous Lanthanide-Doped TiOx Dielectric Films," Appl. Phys. Lett. 74(20):3041-3043 (1999).

Von Rottkay, K. et al., "Influence of stoichiometry on electrochromic cerium-titanium oxide compounds," Presented at the 11th Int'l. Conference of Solid State Ionics, Honolulu, Hawaii, Nov. 19, 1997, Published in Solid State Ionics 113-115:425-430. (1998).

Westlinder, J. et al., "Simulation and Dielectric Characterization of Reactive dc Magnetron Cosputtered (Ta2O5)1-x(TiO2)x Thin Films," J. Vac. Sci. Technol. B 20(3):855-861 (May/Jun. 2002).

Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).

Yoshikawa, K. et al., "Spray formed aluminum alloys for sputtering targets," Powder Metallurgy 43(3):198-199 (2000).

Zhang, H. et al., "High Dielectric Strength, High k TiO2 Films by Pulsed DC, Reactive Sputter Deposition," 5 pages (2001).

Office Action dated Sep. 27, 2004 in U.S. Appl. No. 10/291,179.

Response to Office Action dated Mar. 14, 2005 in U.S. Appl. No. 10/291,179.

Office Action dated Jun. 15, 2005 in U.S. Appl. No. 10/291,179.

Response to Office Action dated Oct. 17, 2005 in U.S. Appl. No. 10/291,179.

Final Office Action dated Dec. 14, 2005 in U.S. Appl. No. 10/291,179.

Response to Final Office Action dated Apr. 14, 2006, in U.S. Appl. No. 10/291,179.

Office Action dated Apr. 27, 2006, in U.S. Appl. No. 10/291,179.

Response to Office Action dated Jul. 27, 2006, in U.S. Appl. No. 10/291,179.

Final Office Action dated Oct. 12, 2006, in U.S. Appl. No. 10,291,179.

Response to Final Office Action dated Nov. 3, 2006, in U.S. Appl. No. 10,291,179.

Office Action dated Dec. 1, 2006, in U.S. Appl. No. 10/291,179.

Response to Office Action and Terminal Disclaimer dated Mar. 1, 2007, in U.S. Appl. No. 10/291,179.

Office Action dated May 2, 2002 in U.S. Patent No. 6,533,907.

Response to Office Action dated Sep. 3, 2002 in U.S. Patent No. 6,533,907.

Notice of Allowance dated Oct. 8, 2002, in U.S. Patent No. 6,533,907.

Office Action dated Feb. 24, 2004 in U.S. Appl. No. 10/101,863.

Response to Office Action dated Jul. 23, 2004 in U.S. Appl. No. 10/101,863.

Office Action dated Oct. 6, 2004 in U.S. Appl. No. 10/101,863.

Office Action dated Jan. 13, 2005, in U.S. Appl. No. 10/101,863.

Response to Office Action dated Jun. 10, 2005 in U.S. Appl. No. 10/101,863.

Office Action dated Aug. 4, 2005, in U.S. Appl. No. 10/101,863.

Response to Office Action dated Dec. 5, 2005, in U.S. Appl. No. 10/101,863.

Final Office Action dated Feb. 14, 2006, in U.S. Appl. No. 10/101,863.

Response to Office Action dated Feb. 24, 2006, in U.S. Appl. No. 10/101,863.

Office Action dated Mar. 22, 2006, in U.S. Appl. No. 10/101,863.

Response to Office Action dated Jun. 12, 2006, in U.S. Appl. No. 10/101,863.

Office Action dated Sep. 6, 2006, in U.S. Appl. No. 10/101,863.

Response to Office Action dated Feb. 6, 2007, in U.S. Appl. No. 10/101,863.

Office Action dated Mar. 25, 2005, received in U.S. Appl. No. 10/954,182.

Response to Office Action dated Jul. 25, 2005 in U.S. Appl. No. 10/954,182.

Office Action dated Oct. 25, 2005, in U.S. Appl. No. 10/954,182.

Response to Office Action dated Dec. 21, 2005 in U.S. Appl. No. 10/954,182.

Office Action dated Mar. 9, 2006, in U.S. Appl. No. 10/954,182.

Response to Office Action dated Aug. 9, 2006 in U.S. Appl. No. 10/954,182.
Office Action dated Oct. 31, 2006, in U.S. Appl. No. 10/954,182.
Response to Office Action dated Dec. 6, 2006, in U.S. Appl. No. 10/954,182.
Office Action dated Mar. 14, 2007, in U.S. Appl. No. 10/954,182.
Supplemental Preliminary Amendment dated Feb. 6, 2007, in U.S. Appl. No. 11/228,834.
Supplemental Preliminary Amendment dated Feb. 6, 2007, in U.S. Appl. No. 11/191,643.
Office Action dated Dec. 2, 2005 in U.S. Appl. No. 10/789,953.
Response to Office Action dated Mar. 2, 2006 in U.S. Appl. No. 10/789,953.
Final Office Action dated May 19, 2006 in U.S. Appl. No. 10/789,953.
Response to Final Office Action dated Aug. 3, 2006, in U.S. Appl. No. 10/789,953.
Notice of Allowance dated Oct. 23, 2006, in U.S. Appl. No. 10/789,953.
Office Action dated Dec. 2, 2005 in U.S. Appl. No. 10/789,953.
Notice of Allowance dated Feb. 21, 2007, in U.S. Appl. No. 10/789,953.
Office Action dated Oct. 12, 2006, for U.S. Appl. No. 11/228,805.
Response to Office Action dated Dec. 21, 2006, in U.S. Appl. No. 11/228,805.
Office Action dated Sep. 22, 2006 from Korean Patent Office in Appl. No. 10-2005-7016055.
Response to Office Action dated Nov. 8, 2006, to the Korean Patent Office in Application No. 10-2005-7016055.
Office Action from Singapore Patent Office in Appl. No. 200505388-9, dated Mar. 20, 2006.
Response to Office Action from Singapore Patent Office in Appl. No. 200505388-9, dated Aug. 11, 2006.
International Search Report dated Oct. 25, 2004 in PCT/US2004/005531.
Written Opinion dated Oct. 25, 2004 in PCT/US2004/005531.
Office Action dated Mar. 24, 2005 in U.S. Appl. No. 10/851,542.
Response to Office Action dated Jul. 25, 2005 in U.S. Appl. No. 10/851,542.
Office Action dated Oct. 19, 2005 in U.S. Appl. No. 10/851,542.
Response to Office Action dated Jan. 19, 2006 in U.S. Appl. No. 10/851,542.
Office Action dated Apr. 19, 2006 in U.S. Appl. No. 10/851,542.
Response to Office Action dated Jul. 26, 2006 in U.S. Appl. No. 10/851,542.
Final Office Action dated Oct. 26, 2006, in U.S. Appl. No. 10/851,542.
Response to Office Action dated Jan. 26, 2007, in U.S. Appl. No. 10/851,542.
Notice of Allowance dated Feb. 22, 2007, in U.S. Appl. No. 10/851,542.
Supplemental Notice of Allowance dated Mar. 15, 2007, in U.S. Appl. No. 10/851,542.
PCT International Search Report and Written Opinion for Application No. PCT/US2004/014524 dated Mar. 2, 2005.
PCT International Preliminary Report on Patentability for Application No. PCT/US2004/014524, dated Dec. 8, 2005.
PCT International Search Report for Application No. PCT/US2004/014523 dated Jan. 17, 2005.
PCT Written Opinion for Application No. PCT/US2004/014523 dated Jan. 17, 2005.
PCT International Preliminary Report on Patentability for Application No. PCT/US2004/014523, dated Dec. 8, 2005.
Preliminary Amendment dated Jul. 21, 2006, in U.S. Appl. No. 11/297,057.
Supplemental Preliminary Amendment, Substitute Specification with Markings, Substitute Specification without Markings, and Replacement Drawing Sheets dated Dec. 6, 2006 in U.S. Appl. No. 11/297,057.
Continuation application and Preliminary Amendment dated Dec. 13, 2006.
Voluntary Amendment dated Aug. 15, 2006 in TW Appl. No. 94143175.
PCT International Search Report and Written Opinion for Application No. PCT/US05/44781 dated Oct. 3, 2006.
Lee, W.J., et al., "Optimizing Indium Tin Oxide Thin Films with Bipolar D.C.-Pulsed Magnetron Sputtering for Electrochromic Device Applications", *J. Mater. Sci: Mat in Elec.*, vol. 13, pp. 751-756, 2002.
Mientus, R., et al., "Reactive Magnetron Sputtering of Tin-Doped Indium Oxide (ITO): Influence of Argon Pressure and Plasma Excitation Mode", *Surface and Coatings Tech.*, 142-144, pp. 748-754, 2001.
Office Action dated May 21, 2007, in U.S. Appl. No. 10/291,179.
Response to Office Action dated Nov. 21, 2007, in U.S. Appl. No. 10/291,179.
Notice of Allowance dated Mar. 4, 2008, in U.S. Appl. No. 10/291,179.
Final Office Action dated May 2, 2007, in U.S. Appl. No. 10/101,863.
Response to Final Office Action filed Oct. 2, 2007, in U.S. Appl. No. 10/101,863.
Office Action dated Nov. 15, 2007, in U.S. Appl. No. 10/101,863.
Response to Office Action dated Dec. 18, 2007, in U.S. Appl. No. 10/101,863.
Notice of Allowance dated Jan. 25, 2008, in U.S. Appl. No. 10/101,863.
Response to Office Action dated Mar. 30, 2007, in Application No. 10/954,182.
Notice of Non-Compliant Amendment dated Apr. 12, 2007, in Application No. 10/954,182.
Response to Notice of Non-Compliant Amendment dated Apr. 23, 2007, in Appl. No, 10/954,182.
Final Office Action dated Jul. 24, 2007, in U.S. Appl. No. 10/954,182.
Amendment/RCE filed Oct. 24, 2007, in U.S. Appl. No. 10/954,182.
Office Action dated Nov. 15, 2007, in U.S. Appl. No. 10/954,182.
Response to Office Action dated Dec. 18, 2007, in U.S. Appl. No. 10/954,182.
Notice of Allowance dated Feb. 1, 2008, in U.S. Appl. No. 10/954,182.
Preliminary Amendment dated Sep. 16, 2005, in U.S. Appl. No. 11/228,834.
Office Action dated May 29, 2008, in U.S. Appl. No. 11/228,834.
Response to Office Action filed Sep. 29, 2008, in U.S. Appl. No. 11/228,834.
Notice of Allowance dated Dec. 30, 2008, in U.S. Appl. No. 11/228,834.
Supplemental Notice of Allowance dated Apr. 23, 2009, in U.S. Appl. No. 11/228,834.
Preliminary Amendment dated Mar. 11, 2008, in U.S. Appl. No. 11/228,717.
Notice of Allowance dated Apr. 2, 2008, in U.S. Appl. No. 11/228,717.
Supplemental Notice of Allowance dated Jul. 17, 2008, in U.S. Appl. No. 11/228,717.
Preliminary Amendment dated Jul. 27, 2005, in U.S. Appl. No. 11/191,643.
Corrected Preliminary Amendment dated Sep. 19, 2005, in U.S. Appl. No. 11/191,643.
Office Action dated Mar. 30, 2009, in U.S. Appl. No. 11/191,643.
Amendment and Response to Office Action filed Sep. 30, 2009, in U.S. Appl. No. 11/191,643.
Notice of Non-Compliant Amendment mailed Nov. 9, 2009, in U.S. Appl. No. 11/191,643.
Response to Notice of Non-Compliant Amendment filed Dec. 9, 2009, in U.S. Appl. No. 11/191,643.
Notice of Non-Compliant Amendment mailed Jan. 25, 2010, in U.S. Appl. No. 11/191,643.
Response to Notice of Non-Compliant Amendment filed Feb. 24, 2010, in U.S. Appl. No. 11/191,643.
Final Office Action dated Apr. 27, 2010, in U.S. Appl. No. 11/191,643.
Amendment with RCE filed Jul. 26, 2010, in U.S. Appl. No. 11/191,643.
Notice of Allowance dated Mar. 26, 2007, in U.S. Appl. No. 11/228,805.

Office Communication with Corrected Notice of Allowance dated Jun. 7, 2007 in U.S. Appl. No. 11/228,805.
Supplemental Notice of Allowance dated Jul. 5, 2007, in U.S. Appl. No. 11/228,805.
First Office Action dated Jul. 25, 2008 from the State Intellectual Property Office of People's Republic of China in Appl. No. 200480005515.5.
Response to First Office Action filed Feb. 9, 2009, with the State Intellectual Property Office of People's Republic of China in Appl. No. 200480005515.5.
First Examination Report dated Sep. 2, 2010, in European Patent Appl. No. 04715009.9.
Decision for Allowance for Registration dated Feb. 1, 2007, in Application No. 10-2005-7016055.
Certificate of Grant of Patent dated Sep. 28, 2007, in Application No. 200505388-9.
Office Action and IPO Search Report dated May 31, 2010, in Application No. 93114493.
Response to Office Action filed Aug. 30, 2010, in Taiwan Appl. No. 93114493.
Allowance Decision of Examination dated Sep. 17, 2010, in Taiwan Application No. 93114493.
International Preliminary Report on Patentability dated Sep. 15, 2005, in PCT/US2004/005531.
Voluntary Amendment dated Mar. 8, 2007, in TW Appl. No. 93114518.
Office Action and IPO Search Report dated Aug. 10, 2010, in Application No. 93114458.
Response to Office Action filed Nov. 11, 2010, in Taiwan Appl, No. 93114518.
Allowance Decision of Examination dated Dec. 13, 2010, in Taiwan Appl. No. 93114518.
Office Action dated Feb. 15, 2008, in U.S. Appl. No. 10/850,968.
Response to Office Action filed Jun. 16, 2008, in U.S. Appl. No. 10/850,968.
Supplemental Amendment filed Jun. 27, 2008, in U.S. Appl. No. 10/850,968.
Final Office Action dated Oct. 15, 2008, in U.S. Appl. No. 10/850,968.
Supplemental Final Office Action dated Dec. 5, 2008, in U.S. Appl. No. 10/850,968.
Amendment After Final filed Apr. 15, 2009, in U.S. Appl. No. 10/850,968.
Office Action mailed Apr. 30, 2009, in U.S. Appl. No. 10/850,968.
Amendment in Response to Office Action filed Oct. 28, 2009, in U.S. Appl. No. 10/850,968.
Final Office Action mailed Feb. 26, 2010, in U.S. Appl. No. 10/850,968.
Final Office Action mailed Apr. 21, 2010, in U.S. Appl. No. 10/850,968.
Amendment After Final filed Jul. 9, 2010, in U.S. Appl. No. 10/850,968.
Advisory Action mailed Jul. 29, 2010, in U.S. Appl. No. 10/850,968.
Supplemental Amendment After Final filed Aug. 23, 2010, in U.S. Appl. No. 10/850,968.
First Office Action dated Jun. 27, 2008 from the State Intellectual Property Office of People's Republic of China in Appl. No. 200480020874.8.
Response to First Office Action filed Jan. 12, 2009, with the State Intellectual Property Office of People's Republic of China in Appl. No. 200480020874.8.
Second Office Action dated Aug. 14, 2009, from the State Intellectual Property Office of P.R.C. in Appl. No. 200480020874.8.
Response to second Office Action filed Dec. 29, 2009, with the State Intellectual Property Office of People's Republic of China in Appl. No. 200480020874.8.
Second Supplemental Preliminary Amendment filed May 31, 2007 in U.S. Appl. No. 11/297,057.
Office Action mailed Jan. 29, 2010, in U.S. Appl. No. 11/297,057.
Amendment and Response to Office Action filed Apr. 29, 2010, in related U.S. Appl. No. 11/297,057.
Final Office Action mailed Jul. 8, 2010, in U.S. Appl. No. 11/297,057.
Amendment and RCE filed Oct. 8, 2010, in U.S. Appl. No. 11/297,057.
Office Action mailed Nov. 1, 2010, in U.S. Appl. No. 11/297,057.
First Office Action dated Jul. 18, 2008 from the State Intellectual Property Office of People's Republic of China in Appl. No. 200580042305.8.
Response to First Office Action filed Feb. 2, 2009, with the State Intellectual Property Office of People's Republic of China in Appl. No. 200580042305.8.
Second Office Action dated May 8, 2009, from the State Intellectual Property Office of People's Republic of China in Appl. No. 200580042305.8.
Response to Second Office Action filed Sep. 22, 2009, with the State Intellectual Property Office of P.R.C., in Appl. No. 200580042305.8.
Third Office Action dated Jan. 29, 2010, from the State Intellectual Property Office of People's Republic of China in Appl. No. 200580042305.8.
Response to Third Office Action filed Apr. 9, 2010, in Appl. No. 200580042305.8.
Notification of Grant of Invention Patent Right and Notification for Completion of Formalities for Registration issued Jun. 11, 2010, in Appl. No. 200580042305.8.
EPO Extended Search Report dated Feb. 26, 2008, for EP Application No. 05853649.1.
Examination Report dated Jul. 24, 2008, for EP Application No. 05853649.1.
Response to Examination Report filed Feb. 3, 2009, for EP Application No. 05853649.1.
Communication Under Rule 71(3) EPC—Intent to Grant dated May 27, 2009, in EP Appl. No. 05853649.1.
Office Action dated Apr. 22, 2010, in Korean Appl. No. 10-2007-7014536.
Response to Office Action filed Aug. 23, 2010, in Appl. No. 10-2007-7014536.
Decision for Allowance of Registration dated Dec. 8, 2010, in Korean Appl. No. 10-2007-7014536.
Office Action dated Nov. 5, 2008 from the Intellectual Property Office (IPO) in Appl. No. 94143175.
Response to Office Action filed May 5, 2009, with the Intellectual Property Office (IPO) in Appl. No. 94143175.
Written Primary Decision of Rejection dated Jan. 6, 2010, from the Intellectual Property Office (IPO) in Appl. No. 94143175.
Statement of Reasons for Re-Examination filed Jun. 29, 2010, in Appl. No. 94143175.
Office Action dated Dec. 29, 2010, in Taiwan Appl. No. 94143175.
International Preliminary Report on Patentability dated Jun. 21, 2007, in PCT/US05/044781.
Office Action dated Feb. 26, 2008, in U.S. App. No. 11/218,652.
Response to Office Action filed Jun. 30, 2008, in U.S. Appl. No. 11/218,652.
Final Office Action dated Oct. 30, 2008, in U.S. Appl. No. 11/218,652.
Amendment/RCE filed Apr. 30, 2009, in U.S. Appl. No. 11/218,652.
Office Action mailed Jul. 9, 2009, in U.S. Appl. No. 11/218,652.
Amendment in Response to Office Action filed Dec. 8, 2009, in U.S. Appl. No. 11/218,652.
Notice of Allowance mailed Feb. 23, 2010, in U.S. Appl. No. 11/218,652.
Notice of Allowance mailed Jul. 22, 2010, in U.S. Appl. No. 11/218,652.
Written Opinion mailed Apr. 3, 2009, from the Australian Patent Office in SG Appl. No. 200801749-3.
Response to Written Opinion filed Dec. 11, 2009, with the Intellectual Property Office of Singapore, in SG Appl. No. 200801749-3.
Final Examination Report dated Mar. 25, 2010, in SG Appl. No. 200801749-3.
PCT International Search Report and Written Opinion for Application No. PCT/US06/33315 mailed Feb. 28, 2008.
PCT International Preliminary Report on Patentability for Application No. PCT/US06/33315 mailed Mar. 19, 2009.

* cited by examiner

| 103 |
|---|
| 102 |
| 201 |
| 102 |
| 103 |
| 101 |

FIG. 5

ENERGY CONVERSION AND STORAGE FILMS AND DEVICES BY PHYSICAL VAPOR DEPOSITION OF TITANIUM AND TITANIUM OXIDES AND SUB-OXIDES

RELATED APPLICATIONS

This is a division of application Ser. No. 10/851,542, filed May 20, 2004, now U.S. Pat. No. 7,238,628 which claims the benefit of U.S. Provisional Application No. 60/473,375, filed May 23, 2003, both of which are incorporated herein by reference in their entirety.

BACKGROUND

1. Field of the Invention

The present invention is related to fabrication of thin films for planar energy and charge storage and energy conversion and, in particular, thin films deposited of titanium and titanium oxides, sub oxides, and rare earth doped titanium oxides and sub oxides for planar energy and charge storage and energy conversion.

2. Discussion of Related Art

Currently, titanium oxide layers are not utilized commercially in energy storage, charge storage, or energy conversion systems because such layers are difficult to deposit, difficult to etch, are known to have large concentrations of defects, and have poor insulation properties due to a propensity for oxygen deficiency and the diffusion of oxygen defects in the layers. Additionally, amorphous titania is difficult to deposit due to its low recrystalization temperature (about 250° C.), above which the deposited layer is often a mixture of crystalline anatase and rutile structures.

However, such amorphous titania layers, if they can be deposited in sufficient quality, have potential due to their high optical index, n~2.7, and their high dielectric constant, k less than or equal to about 100. Further, they have substantial chemical stability. There are no known volatile halides and titania is uniquely resistant to mineral acids. Amorphous titania is thought to have the further advantage that there are no grain boundary mechanisms for electrical breakdown, chemical corrosion, or optical scattering. It is also well known that the sub oxides of titanium have unique and useful properties. See, e.g., Hayfield, P. C. S., "Development of a New Material—Monolithic $Ti_4O_7$ Ebonix Ceramic", Royal Society Chemistry, ISBN 0-85405-984-3, 2002. Titanium monoxide, for example, is a conductor with a uniquely stable resistivity with varying temperature. Additionally, $Ti_2O_3$, which can be pinkish in color, is known to have semiconductor type properties. However, these materials have not found utilization because of their difficult manufacture in films and their susceptibility to oxidation. Further, $Ti_4O_7$ demonstrates both useful electrical conductivity and unusual resistance to oxidation. $Ti_4O_7$, however, is also difficult to fabricate, especially in thin film form.

Additional to the difficulty of fabricating titanium oxide or sub oxide materials in useful thin film form, it also has proven difficult to dope these materials with, for example, rare earth ions, in useful or uniform concentration.

Therefore, utilization of titanium oxide and suboxide films, with or without rare earth doping, has been significantly limited by previously available thin film processes. If such films could be deposited, their usefulness in capacitor, battery, and energy conversion and storage technologies would provide for many value-added applications.

Current practice for construction of capacitor and resistor arrays and for thin film energy storage devices is to utilize a conductive substrate or to deposit the metal conductor or electrode, the resistor layer, and the dielectric capacitor films from various material systems. Such material systems for vacuum thin films, for example, include copper, aluminum, nickel, platinum, chrome, or gold depositions, as well as conductive oxides such as ITO, doped zinc oxide, or other conducting materials.

Materials such as chrome-silicon monoxide or tantalum nitride are known to provide resistive layers with 100 parts per million or less resistivity change per degree Centigrade for operation within typical operating parameters. A wide range of dielectric materials such as silica, silicon nitride, alumina, or tantalum pentoxide can be utilized for the capacitor layer. These materials typically have dielectric constants k of less than about twenty four (24). In contrast, $TiO_2$ either in the pure rutile phase or in the pure amorphous state can demonstrate a dielectric constant as high as 100. See, e.g., R. B. van Dover, "Amorphous Lanthanide-Doped $TiO_2$ Dielectric Films," Appl. Phys Lett., Vol. 74, no. 20, p. 3041-43 (May 17, 1999).

It is well known that the dielectric strength of a material decreases with increasing value of dielectric constant k for all dielectric films. A 'figure of merit' (FM) is therefore obtained by the product of the dielectric constant k and the dielectric strength measured in Volts per cm of dielectric thickness. Capacitive density of 10,000 to 12,000 pico Farads/mm$^2$ is very difficult to achieve with present conductors and dielectrics. Current practice for reactive deposition of titanium oxide has achieved a figure-of-merit, FM, of about 50 (k MV/cm). See J. Y. Kim et al., "Frequency-Dependent Pulsed Direct Current Magnetron Sputtering of Titanium Oxide Films," J. Vac. Sci. Technol. A 19(2), 2001.

Therefore, there is an ongoing need for titanium oxide and titanium sub-oxide layers, and rare-earth doped titanium oxide and titanium sub-oxide layers, for various applications.

SUMMARY

In accordance with the present invention, high density oxide films are deposited by a pulsed-DC, biased, reactive sputtering process from a titanium containing target. A method of forming a titanium based layer or film according to the present invention includes depositing a layer of titanium containing oxide by pulsed-DC, biased reactive sputtering process on a substrate. In some embodiments, the layer is $TiO_2$. In some embodiments, the layer is a sub-oxide of Titanium. In some embodiments, the layer is $Ti_xO_y$, wherein x is between about 1 and about 4 and y is between about 1 and about 7.

In some embodiments of the invention, the figure of merit of the layer is greater than 50. In some embodiments of the invention, the layer can be deposited between conducting layers to form a capacitor. In some embodiments of the invention, the layer includes at least one rare-earth ion. In some embodiments of the invention, the at least one rare-earth ion includes erbium. In some embodiments of the invention, the erbium doped layer can be deposited between conducting layers to form a light-emitting device. In some embodiments of the invention, the erbium doped layer can be an optically active layer deposited on a light-emitting device. In some embodiments of the invention, the layer can be a protective layer. In some embodiments, the protective layer can be a catalytic layer.

In some embodiments of the invention, the layer and a $TiO_2$ layer can be deposited between conducting layers to form a capacitor with decreased roll-off characteristics with decreasing thickness of the $TiO_2$ layer. In some embodiments, the TiO₂ layer can be a layer deposited according to some embodiments of the present invention.

These and other embodiments of the present invention are further discussed below with reference to the following figures.

SHORT DESCRIPTION OF THE FIGURES

FIG. 5 shows another layer structure involving one or more layers according to the present invention.

In the figures, elements having the same designation have the same or similar functions.

DETAILED DESCRIPTION

Miniaturization is driving the form factor of portable electronic components. Thin film dielectrics with high dielectric constants and breakdown strengths allow production of high density capacitor arrays for mobile communications devices and on-chip high-dielectric capacitors for advanced CMOS processes. Thick film dielectrics for high energy storage capacitors allow production of portable power devices.

Some embodiments of films deposited according to the present invention have a combination of high dielectric and high breakdown voltages. Newly developed electrode materials allow the production of very thin films with high capacitance density. The combination of high dielectric and high breakdown voltages produce thick films with new levels of available energy storage according to $E=\frac{1}{2}CV^2$.

Deposition of materials by pulsed-DC biased reactive ion deposition is described in U.S. patent application Ser. No. 10/101,863, entitled "Biased Pulse DC Reactive Sputtering of Oxide Films," to Hongmei Zhang, et al., filed on Mar. 16, 2002. Preparation of targets is described in U.S. patent application Ser. No. 10/101,341, entitled "Rare-Earth Pre-Alloyed PVD Targets for Dielectric Planar Applications," to Vassiliki Milonopoulou, et al., filed on Mar. 16, 2002. U.S. patent application Ser. No. 10/101,863 and U.S. patent application Ser. No. 10/101,341 are each assigned to the same assignee as is the present disclosure and each is incorporated herein in their entirety. Additionally, deposition of materials is further described in U.S. Pat. No. 6,506,289, which is also herein incorporated by reference in its entirety.

Figure 1A:
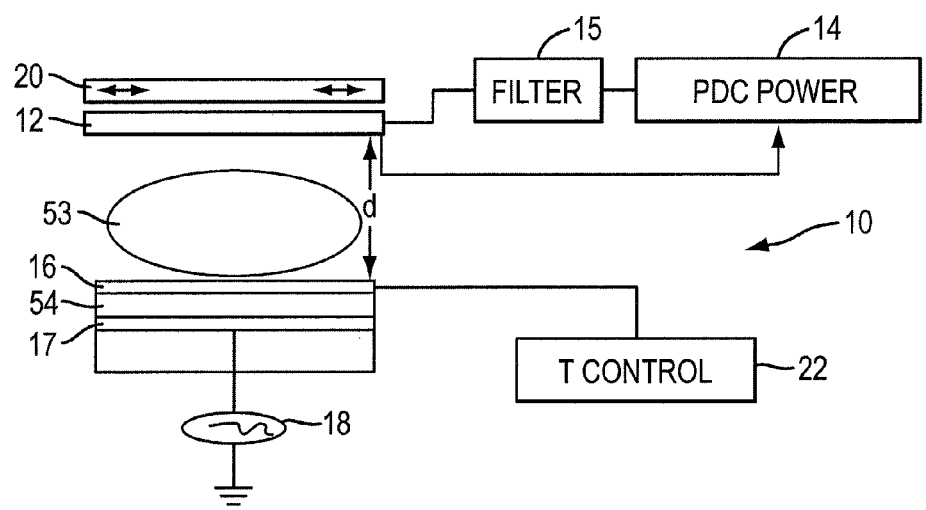
FIGS. 1A and 1B illustrate a pulsed-DC biased reactive ion deposition apparatus that can be utilized in the deposition according to the present invention.

FIG. 1A shows a schematic of a reactor apparatus 10 for sputtering of material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three deposition chambers connected by a vacuum transport chamber. These AKT reactors can be modified such that pulsed DC (PDC) power is supplied to the target and RF power is supplied to the substrate during deposition of a material film. The PDC power supply 14 can be protected from RF bias power 18 by use of a filter 15 coupled between PDC power supply 14 and target 12.

Apparatus 10 includes a target 12 which is electrically coupled through a filter 15 to a pulsed DC power supply 14. In some embodiments, target 12 is a wide area sputter source target, which provides material to be deposited on substrate 16. Substrate 16 is positioned parallel to and opposite target 12. Target 12 functions as a cathode when power is applied to it and is equivalently termed a cathode. Application of power to target 12 creates a plasma 53. Substrate 16 is capacitively coupled to an electrode 17 through an insulator 54. Electrode 17 can be coupled to an RF power supply 18. Magnet 20 is scanned across the top of target 12.

For pulsed reactive dc magnetron sputtering, as performed by apparatus 10, the polarity of the power supplied to target 12 by power supply 14 oscillates between negative and positive potentials. During the positive period, the insulating layer on the surface of target 12 is discharged and arcing is prevented. To obtain arc free deposition, the pulsing frequency exceeds a critical frequency that depends on target material, cathode current and reverse time. High quality oxide films can be made using reactive pulsed DC magnetron sputtering in apparatus 10.

Pulsed DC power supply 14 can be any pulsed DC power supply, for example an AE Pinnacle plus 10K by Advanced Energy, Inc. With this example supply, up to 10 kW of pulsed DC power can be supplied at a frequency of between 0 and 350 KHz. In some embodiments, the reverse voltage is 10% of the negative target voltage. Utilization of other power supplies will lead to different power characteristics, frequency characteristics, and reverse voltage percentages. The reverse time on this embodiment of power supply 14 can be adjusted to between 0 and 5 μs.

Filter 15 prevents the bias power from power supply 18 from coupling into pulsed DC power supply 14. In some embodiments, power supply 18 can be a 2 MHz RF power supply, for example a Nova-25 power supply made by ENI, Colorado Springs, Colo.

Therefore, filter 15 can be a 2 MHz band sinusoidal rejection filter. In some embodiments, the bandwidth of the filter can be approximately 100 kHz. Filter 15, therefore, prevents the 2 MHz power from the bias to substrate 16 from damaging power supply 18.

However, both RF sputtered and pulsed DC sputtered films are not fully dense and may typically have columnar structures. These columnar structures are detrimental to thin film applications. By applying a RF bias on wafer 16 during deposition, the deposited film can be densified by energetic ion bombardment and the columnar structure can be substantially eliminated or completely eliminated.

In the AKT-1600 based system, for example, target 12 can have an active size of about 675.70×582.48 by 4 mm in order to deposit films on substrate 16 that have dimension about 400×500 mm. The temperature of substrate 16 can be held at between −50 C and 500 C by introduction of back-side gas in a physical or electrostatic clamping of the substrate, thermoelectric cooling, electrical heating, or other methods of active temperature control. In FIG. 1A, a temperature controller 22 is shown to control the temperature of substrate 16. The distance between target 12 and substrate 16 can be between about 3 and about 9 cm. Process gas can be inserted into the chamber of apparatus 10 at a rate up to about 200 sccm while the pressure in the chamber of apparatus 10 can be held at between about 0.7 and 6 millitorr. Magnet 20 provides a magnetic field of strength between about 400 and about 600 Gauss directed in the plane of target 12 and is moved across target 12 at a rate of less than about 20-30 sec/scan. In some embodiments utilizing the AKT 1600 reactor, magnet 20 can be a race-track shaped magnet with dimension about 150 mm by 600 mm.

Figure 1B:
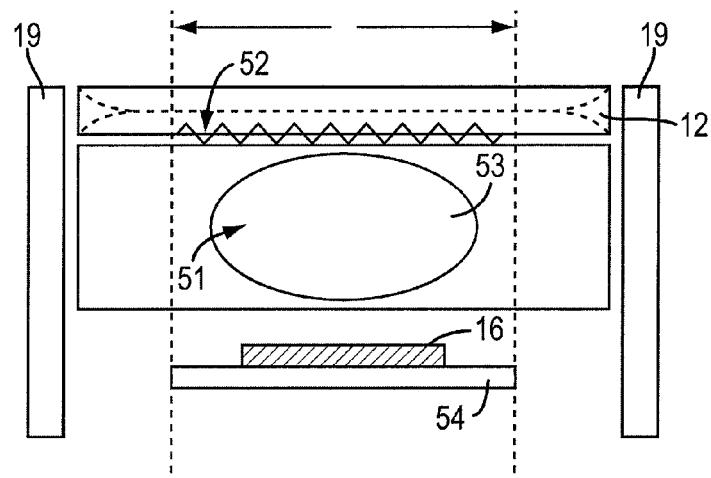
Figure 2:
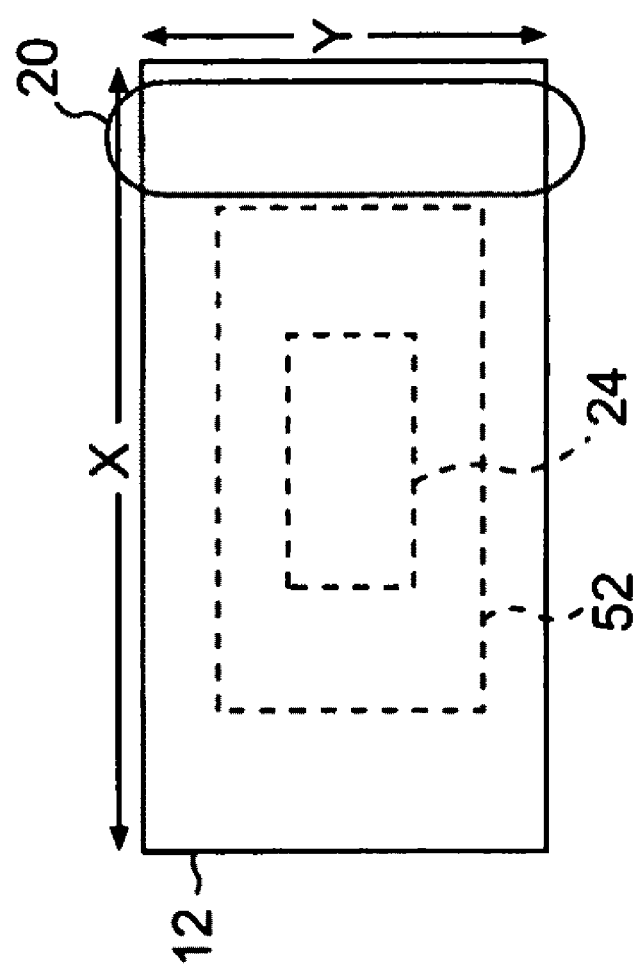
FIG. 2 shows an example of a target that can be utilized in the reactor illustrated in FIGS. 1A and 1B.

FIG. 2 illustrates an example of target 12. A film deposited on a substrate positioned on carrier sheet 54 directly opposed to region 52 of target 12 has good thickness uniformity. Region 52 is the region shown in FIG. 1B that is exposed to a uniform plasma condition. In some implementations, carrier 54 can be coextensive with region 52. Region 24 shown in FIG. 2 indicates the area below which both physically and chemically uniform deposition can be achieved, where physical and chemical uniformity provide refractive index uniformity, for example. FIG. 2 indicates that region 52 of target 12 that provides thickness uniformity is, in general, larger than region 24 of target 12 providing thickness and chemical uniformity. In optimized processes, however, regions 52 and 24 may be coextensive.

In some embodiments, magnet 20 extends beyond area 52 in one direction, the Y direction in FIG. 2, so that scanning is necessary in only one direction, the X direction, to provide a time averaged uniform magnetic field. As shown in FIGS. 1A and 1B, magnet 20 can be scanned over the entire extent of target 12, which is larger than region 52 of uniform sputter erosion. Magnet 20 is moved in a plane parallel to the plane of target 12.

The combination of a uniform target 12 with a target area 52 larger than the area of substrate 16 can provide films of highly uniform thickness. Further, the material properties of the film deposited can be highly uniform. The conditions of sputtering at the surface of target 12, such as the uniformity of erosion, the average temperature of the plasma at the target surface and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform optical properties such as index of refraction, density, transmission, or absorptivity.

Target 12 can be formed of any materials, but is typically metallic materials such as, for example, combinations of In and Sn. Therefore, in some embodiments, target 12 includes a metallic target material formed from intermetallic compounds of optical elements such as Si, Al, Er and Yb. Additionally, target 12 can be formed, for example, from materials such as La, Yt, Ag, Au, and Eu. To form optically active films on substrate 16, target 12 can include rare-earth ions. In some embodiments of target 12 with rare earth ions, the rare earth ions can be pre-alloyed with the metallic host components to form intermetallics. See U.S. application Ser. No. 10/101, 341.

In several embodiments of the invention, material tiles are formed. These tiles can be mounted on a backing plate to form a target for apparatus 10. A wide area sputter cathode target can be formed from a close packed array of smaller tiles. Target 12, therefore, may include any number of tiles, for example between 2 to 20 individual tiles. Tiles are finished to a size so as to provide a margin of non-contact, tile to tile, less than about 0.010" to about 0.020" or less than half a millimeter so as to eliminate plasma processes that may occur between adjacent ones of the tiles. The distance between the tiles of target 12 and the dark space anode or ground shield 19 in FIG. 1B can be somewhat larger so as to provide non contact assembly or provide for thermal expansion tolerance during processing, chamber conditioning, or operation.

As shown in FIG. 1B, a uniform plasma condition can be created in the region between target 12 and substrate 16 in a region overlying substrate 16. A plasma 53 can be created in region 51, which extends under the entire target 12. A central region 52 of target 12, can experience a condition of uniform sputter erosion. As discussed further below, a layer deposited on a substrate placed anywhere below central region 52 can then be uniform in thickness and other properties (i.e., dielectric, optical index, or material concentrations). In addition, region 52 in which deposition provides uniformity of deposited film can be larger than the area in which the deposition provides a film with uniform physical or optical properties such as chemical composition or index of refraction. In some embodiments, target 12 is substantially planar in order to provide uniformity in the film deposited on substrate 16. In practice, planarity of target 12 can mean that all portions of the target surface in region 52 are within a few millimeters of a planar surface, and can be typically within 0.5 mm of a planar surface.

Figure 3A:
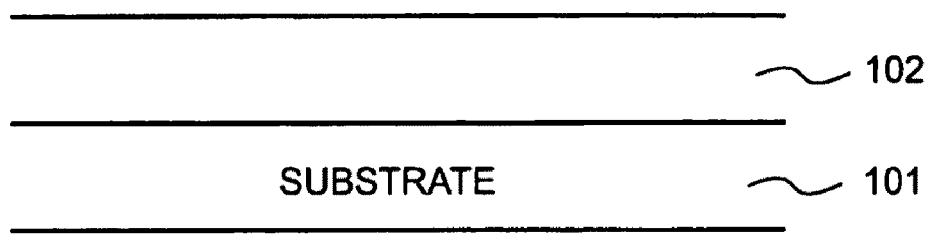
FIGS. 3A and 3B illustrate various configurations of layers according to embodiments of the present invention.
Figure 3B:
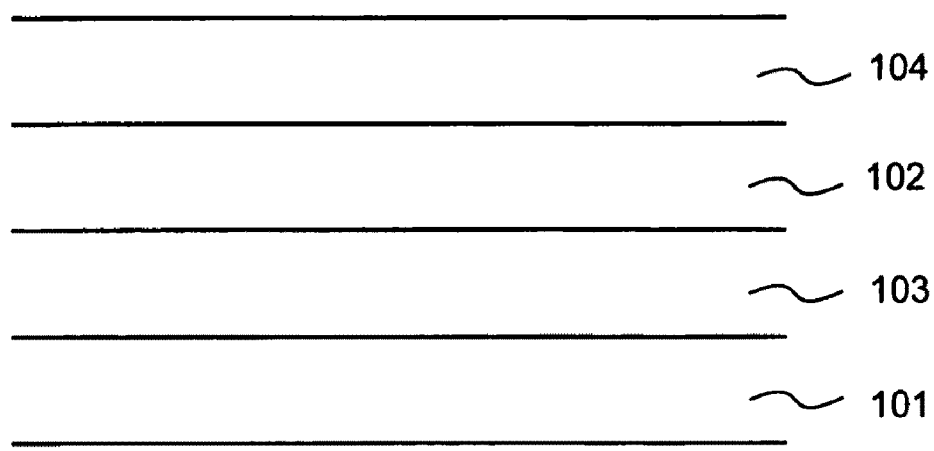

FIG. 3A illustrates deposition of a layer 102 according to the present invention deposited on a substrate 101. In some embodiments, layer 102 can be a conducting protective layer of $TiO_y$. FIG. 3B shows a first layer 102 according to the present invention deposited over a second layer 103, which can also be a layer according to some embodiments of the present invention. In some embodiments, first layer 102 can be a conducting protective layer and second layer 103 can be a titanium or other conducting layer. Layer 103 is deposited on substrate 101.

The fabrication of high density capacitor and resistor arrays as well as high energy storage solid state devices can be accomplished with embodiments of processes according to the present invention on a wide variety of substrates such as silicon wafers or glass or plastic sheets at low temperature and over wide area. With reference to FIG. 3B, layer 102 can be an amorphous film of $TiO_2$, which is deposited by a process such as that described in U.S. application Ser. No. 10/101,341. Utilization or formation of a conducting layer 103 such as TiO or $Ti_4O_7$ between a conducting layer of titanium, which is substrate 101, and the dielectric $TiO_2$ layer 102 is shown in the present invention to substantially reduce or eliminate the 'roll off' of the dielectric constant k with decreasing film thickness below about 1000 Angstroms. Consequently, capacitors fabricated from titanium on low temperature substrates result in high value planar capacitors and capacitor arrays with very high capacitive density and low electrical leakage. Such electrical arrays are useful for shielding and filtering and buffering high frequency and may be used in stationary as well as in portable electronic devices.

In particular, the low temperature deposition of amorphous titania capacitors provides for the fabrication of integrated passive electronic circuits on plastic and glass. It also provides for the integration of such devices on other electronic devices and arrays at low temperature.

Similarly, a conducting layer of TiO or $Ti_4O_7$ as layer 103 in FIG. 3B, deposited between a conducting layer of titanium as layer 101 and a layer of titania as layer 102 of FIG. 3B can be deposited so as to provide an increase in the surface smoothness by planarization of the titanium in layer 101 or other metallurgical conductive substrate layer 101 of FIG. 3B. Consequently, roughness or asperity based defects can be minimized or eliminated. As an example, charge injection from a metallurgical electrode can be decreased at the interface with a dielectric. The titanium based dielectric layer can be formed on a smooth conducting oxide layer, which according to some theories can prevent charge depletion of the high k dielectric layer, decrease point charge accumulation and support dipole formation at the conductor-dielectric interface, sometimes referred to as dipole coupling. These features are important to prevent the roll-off of the dielectric strength of the dielectric layer as the layer thickness is decreased below about 1000 Å. It is consequently useful in the formation of thin layers having high capacitive value.

A thick film of dielectric material may be deposited having a high dielectric strength for the storage of electrical energy. Such energy is well known to increases with the square of the applied Voltage. For example, in FIG. 3B layer 102 can be a thick layer of dielectric according to the present invention. Layer 104 in FIG. 3B, then, can be a conducting layer deposited on layer 102 while layer 103 is a conducting layer deposited between a substrate 101 and layer 102 to form a capacitor. As the dielectric strength of the amorphous dielectric layer of layer 102 increases in proportion to it's thickness, the energy storage also increases effectively as the square of the thickness. It is shown that both record capacitance density and electrical energy storage density result for films according to the present invention. For thick film applications, smoothing of the metallurgical electrode by a conductive sub-oxide can decrease leakage at the interface in high voltage applications.

Protective conductive sub-oxide films of titanium can also be deposited on conductive and insulating substrates to protect them from harmful chemical attack while acting as conducting layers. For example, as illustrated in FIG. 3A layer 102 can be a protective conductive sub-oxide film deposited on substrate 101. These layers can be used to protect an electrode, which can be substrate 101, from oxidation in the gas phase and in the liquid phase as well as the solid phase. Examples of such applications include electrolytic energy storage or as an active electrode surface for catalytic reactions and energy conversion such as in the oxygen-hydrogen fuel cell. Transparent oxides and semi-transparent sub-oxides can be deposited sequentially so that the conducting sub-oxides are protected by the transparent non-conducting oxides for purposes of photovoltaic or electrochromic energy conversion devices. It is well known that organic based photovoltaic cells are enhanced by the presence of titania in the organic absorbing layer. Layers according to the present invention can be utilized both for the conductivity of electricity, the enhancement of the organic absorber, as well as the overall protection of the device.

$TiO_2$ layers, for example, can photocatylitically produce ozone in the presence of sunlight. However, in the course of such activity, the $TiO_2$ layer can build up a fixed charge.

Absent a metallurgical conductor, as shown in FIG. 3B layer 102 can be a catalytic oxide while layer 103 can be a conducting suboxide while substrate 101 is a dielectric substrate such as glass or plastic and layer 104 is absent. In such a two-layer device, where the oxide is provided on the surface of the sub-oxide, the sub-oxide can form an electrode so that electric charge can be conducted to the oxide layer for enhanced photochemical photolysis such as in an AC device, or for the purpose of charge dissipation.

Protective conductive sub-oxide films of titanium can also be deposited on conductive and insulating substrates to protect them from harmful chemical attack while acting as conducting layers for electrolytic energy storage or as an active electrode for catalytic energy conversion. Transparent and semi-transparent oxides can be deposited sequentially so that the conducting suboxides are protected by the transparent non-conducting oxide for purposes of protecting layered devices. Alternatively, it is well known that certain crystalline suboxides of titania, collectively referred to as Magnelli phases, posses unusual levels of durability to mineral acid solutions and other corrosive gassious or liquid environments. Hayfield, P. C. S., "Development of a New Material—Monolithic $Ti_4O_7$ Ebonix Ceramic", Royal Society Chemistry, ISBN 0-85405-984-3, 2002 describes these in detail and discusses many applications of the monolithic suboxides. Hayfield also explains that the basis of conductivity of sub-oxides is due to the presence of the $Ti^{+2}$ cation in layers having the stoichiometry TiO. Of the several compositions, $Ti_4O_7$ in particular is known to posses both useful conductivity and also chemical resistance to both anodization, which would decrease it's conductivity, as well as reduction, which would decrease it's chemical durability. Therefore, as shown in FIG. 3A, substrate 101 can be a metallurgical substrate such as aluminum or titanium and layer 102 can be $Ti_4O_7$. An example is the catalytic of $H_2$ and $O_2$ to make water and electricity.

In this disclosure, an amorphous coating layer according to embodiments of the present invention, derived from a crystalline target of $Ti_4O_7$, can obtain a similar composition as described above, measured as $Ti_4O_{6.8}$. Similar useful levels of chemical conductivity can be obtained. The sputtered film was dense, adherent, and also displayed robust durability to immersion in concentrated mineral acid and oxidizing solution. A similar material was deposited directly from a titanium target using the subject reactive sputtering process.

The increased density of the amorphous sputtered film according to embodiments of the present invention such as film 102 shown in FIG. 3A can provide high levels of impermeability. Planarization can also be achieved by layer 102 over structures on substrate 101. Layer 102 can therefore achieve 'atomic' smooth surfaces on otherwise rough substrates. The sputtering process according to the present invention also allows the formation of a continuous range of stoichiometry between what are, in their crystalline environment, 'line compounds' with whole number integer ratios of titanium cations to oxygen atoms. In the present amorphous films, as long as one $Ti^{+2}$ has a nearest neighbor cation in the amorphous glass matrix with the $Ti^{+2}$ valence, conductive paths will be available in the sputtered film.

The sputtered sub-oxides also have the advantage that they can be layered, without removal from the vacuum system, with metallic titanium, other sub-oxides, as well as $TiO_2$ for connection to electrical conduction and insulation. This feature provides the utility of multilayer depositions by integrated processes in one vacuum chamber. Where thick films of a particular sub-oxide are desired, a target 12 (FIG. 1) fabricated of the desired sub-oxide can be utilized. TiO is particularly a good conductor and possesses very stable resistivity with temperature variation. $Ti_2O_3$ is a semiconductor. The higher oxygen-containing Magnelli compositions obtain higher resistivity as well as increased chemical stability and robustness and can be utilized as a resistive layer or as a protective, conductive layer.

Erbium doped $TiO_2$ is known to display useful levels of photoluminescence. And rare earth doped titanium oxide is known to display decreased levels of electrical leakage current under conditions of high electrical field. Layer 102 of FIG. 3B, deposited according to some embodiments of the present invention, then can be erbium doped $TiO_2$ and therefore displays very high level of breakdown and very low leakage under electrical stress. Additionally, a capacitor can be formed by deposition of conductors as layers 103 and 104 on a substrate 101. Consequently, capacitive and energy storage devices formed from rare earth doped layers formed according to the present invention are extremely useful for very high field applications such as capacitors, high voltage dielectric batteries, and electro luminescent devices and also for low-leakage devices.

A TiO or erebium-doped TiO target, target 12 of FIG. 1A, can be formed by mixing of TiO powder or TiO powder and Erbium or Erbium-Oxide powder. TiO powder can be formed from the partial oxygenation in a controlled furnace. The mixed powder is then hipped under a controlled environment (for example hydrogen or $CO_2$) to a high density to form tiles. As discussed above, such tiles can be mounted to form target 12. Additionally, other rare-earth doped titanium containing targets can be formed in the same fashion.

As an example, a layer of erbium doped titania or titania containing alloy deposited by means of the present invention, could be coupled as a continuous oxide layer to a photo diode constructed proximate to dielectric layer 102 of FIG. 3A. Such an arrangement could provide an optical means for the measurement of the applied electrical field or the leakage current.

Alternatively, such a rare earth doped dielectric layer 102 might be coupled to conducting transparent oxides so that a light wave device might be provided for the conversion of electrical energy to light energy. In another embodiment, a titanium oxide containing a rare earth ion can be deposited directly on a light emitting diode device so that the rare earth ion can absorb some or all of the light emitted by the diode and re-fluoresce that light at another wavelength. In this embodiment, layer 102 can be a rare earth containing titanium oxide or sub oxide and substrate 101 includes a light emitting diode. An example of this may be the conversion of blue light from a LED to yellow-green light by layer 102. In that case, layer 102 may be cerium doped titanium oxide or sub-oxide. Partial absorption of the blue light by layer 102 with conversion to yellow-green light by layer 102 would result in a white light source. Other colors of light can be obtained by doping the titanium oxide or sub-oxide with other rare earth ions.

Figure 4A:
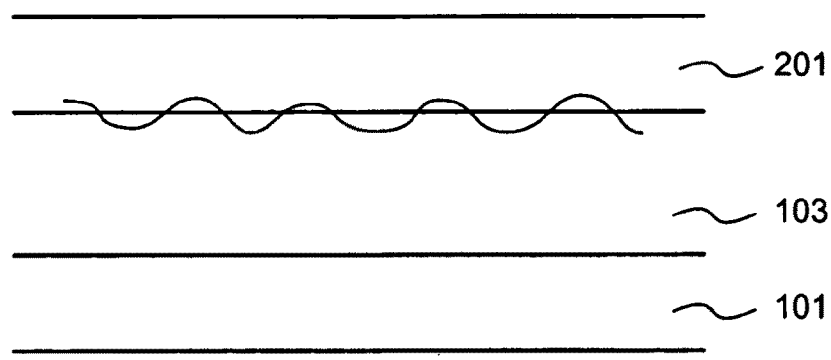
FIGS. 4A and 4B illustrate further various configurations of layers according to embodiments of the present invention.
Figure 4B:
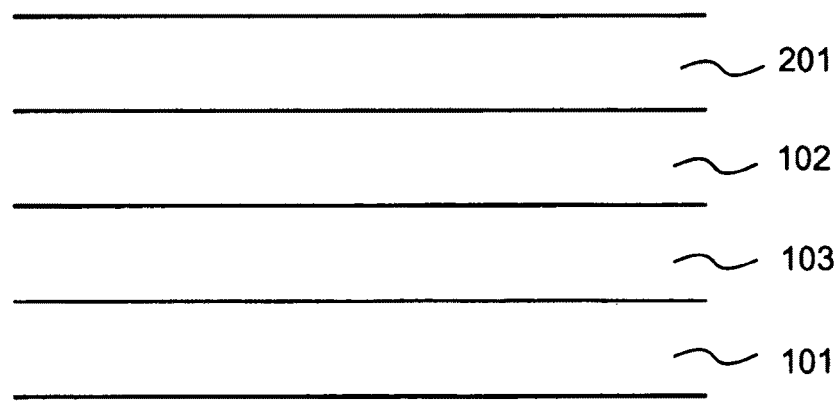

FIGS. 4A and 4B illustrate further stackings of layers according to embodiments of the present invention. For example, layer 201 can be a $TiO_2$ dielectric protective deposited over a conducting layer 103 on substrate 101. FIG. 4B can show dielectric protective layer 201 deposited over conducting protective layer 102 of $TiO_y$, which is deposited on a metal conducting layer 103 on substrate 101. The $TiO_y$ conducting protective layer can act as a smoothing layer, resulting in a better barrier layer in dielectric 201. The end result is a better roll-off characteristic than has previously been obtained.

In general, layer 102 can be formed of any $Ti_xO_y$ layer or rare earth doped $Ti_xO_y$ layer according to the present invention. As illustrated here, layers of various compositions of $Ti_xO_y$, with or without rare-earth doping, have various properties. In some embodiments of the invention, x can be between about 1 and about 4 and y can be between about 1 and about 7.

FIG. 5 shows an example of a capacitor stack according to the present invention. A metal conducting layer 103 is deposited on substrate 101. A conducting protective layer 102 is deposited over conducting layer 103 and a $TiO_2$ dielectric protective layer is deposited over the protective conducting layer 102. Another protective conducting layer 102 can be deposited over the $TiO_2$ dielectric layer and a metal layer can be deposited over the protective conducting layer 102. The resulting capacitor stack has upper and lower smoothing due to the two $TiO_y$ layers and results in improved roll-off characteristics in the dielectric constant. Such capacitor stacks can be very useful in energy storage devices.

Figure 6:
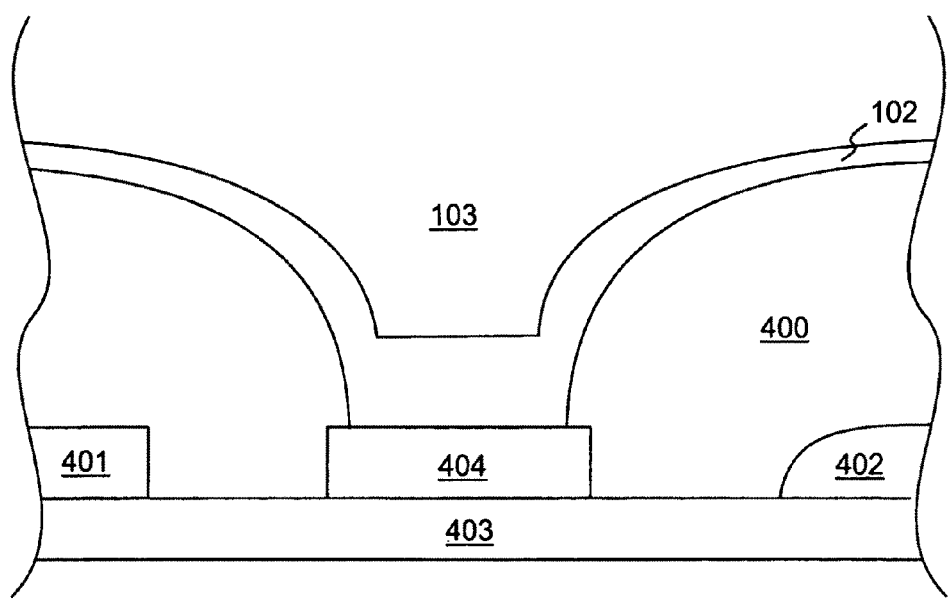
FIG. 6 shows a transistor gate with a TiOy layer according to the present invention.

FIG. 6 shows a transistor structure according to the present invention. A source 401, drain 402 and gate structure 404 are deposited on a semiconducting substrate 403. An intermediate dielectric 400 can then be deposited over the source, drain and gate structure. A protective conducting layer 102, which can be formed of $TiO_y$, can then be deposited over an opening in the intermediate dielectric layer 400 followed by a conducting layer 103. The protective conducting layer 102 prevents roll-off of the gate dielectric 404.

Example 1

Deposition of $Ti_4O_7$ Film

In this example, $Ti_4O_7$ films were deposited using a Pulse DC scanning magnetron PVD process as was previously described in U.S. application Ser. No. 10/101,341. The target was a about 1 mm thick, about 16.5×12.5 mm² tiles of titanium oxide target obtained from a sheet of Ebonex™ which compounded of bulk $Ti_4O_7$ was bonded onto a backing plate. Ebonex™ can be obtained from Atraverda Ltd., Oakham Business Park, Mansfield, UK. A pulsed DC generator from Advanced Energy (Pinnacle Plus) was used as the target power supply. The pulsing frequency can be varied from 0-350 KHz. Reversed duty cycle can be varied from 1.3 µs to 5 µs depending on the pulsing frequency. Target power was fixed at 2 KW and pulsing frequency was 200 KHz during deposition, Ar flow rate is 100 sccm. The deposition rate at this condition is 14 Å/sec over a 40 by 50 cm substrate 101. A 100 W at 2 MHz bias was supplied to the substrate. The bias power supply can be an RF supply produced by ENI.

Utilizing the above parameters, a layer 102 of FIG. 3A was deposited on a substrate 101 of 150 mm p-type Si wafer. The sheet resistance was measured using 4 point probe to be 140 ohms/sq, with film thickness of 1.68 µm. The resistivity of the resulting film is measured to be 0.023 ohms-cm. The composition of film was determined using EDX to be $Ti_4O_{6.8}$.

Example 2

Deposition of TiO2 on Ti—Ti4O7 Film Stack

In this example, $TiO_2$ films were deposited using a 2 MHz RF biased, Pulse DC scanning magnetron PVD process as was previously described in U.S. application Ser. No. 10/101, 341. The substrate size can be up to 600×720 mm². The target was a ~7 mm thick, ~630×750 mm² Ti plate of 99.9% purity. A pulsed DC generator, or PDC power supply from Advanced Energy (Pinnacle Plus) was used as the target power supply. The pulsing frequency can be varied from 0-350 KHz. Reversed duty cycle can be varied from 1.3 µs to 5 µs depending on the pulsing frequency. An ENI RF generator and ENI Impedance matching unit were used for the substrate bias. A 100 W with a 2 MHz RF generator, which can be an EFI supply, was utilized. The chamber base pressure was kept below $2 \times 10^{-7}$ Torr. The substrate temperature was below 200° C. during deposition.

A systematic DOE (design of experiments) were carried out on both n++ type bare Si wafers and Al metallized wafers. All n++ wafers were HF cleaned just before loading into the chamber for deposition. A series of 150 nm thick, Al films were deposited onto the bare Si wafers using the same PVD system at low temperature (<100° C.).

The total PDC target power, pulsing frequency, oxygen partial pressure, and substrate bias power were variables in the DOE. Total gas flow of Ar and $O_2$ were kept constant at 100 sccm. The PDC target power was between 4 and 7 kW with a pulsing frequency of between 100 and 250 kHz. The oxygen flow rate ranged from 30 to 60%. The bias power ranged from 0 to 300 W at 2 Mhz. Both dielectric strength and breakdown voltage were measured using a mercury probe. Film thickness in this DOE range from 100 nm to 270 nm.

Figure 7:
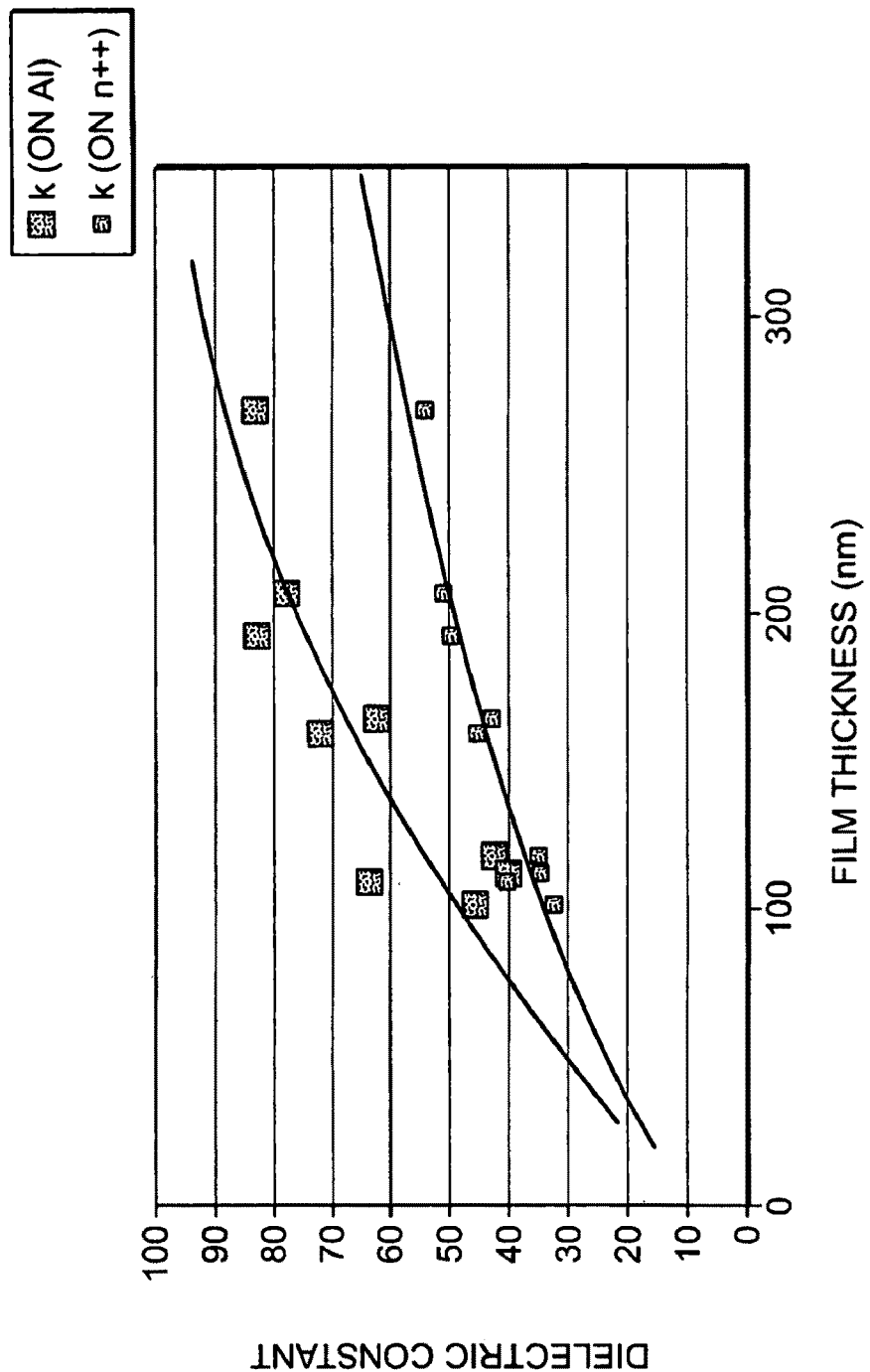
FIG. 7 illustrates the roll-off of the dielectric constant with decreasing film thickness.

Therefore, with reference to FIG. 3B, layer 101 is the Si wafer substrate, layer 103 is the 150 nm thick Al layer, layer 102 is the $Ti_4O_7$ layer, and layer 104 is $TiO_2$. FIG. 7 shows the thickness dependence of the dielectric constant of layer 102, showing the roll off effect. The capacitance of the layer stack 101, 103, 102, and 104 was measured with a mercury electrode impressed upon layer 104 and coupled to layer 103. The precise thickness of dielectric layer 104 was measured optically. The dielectric constant of layer 104 was then calculated from the measured capacitance. As shown in FIG. 7, the $TiO_2$ film thickness decreases, so does the dielectric constant of the $TiO_2$ film.

Figure 8:
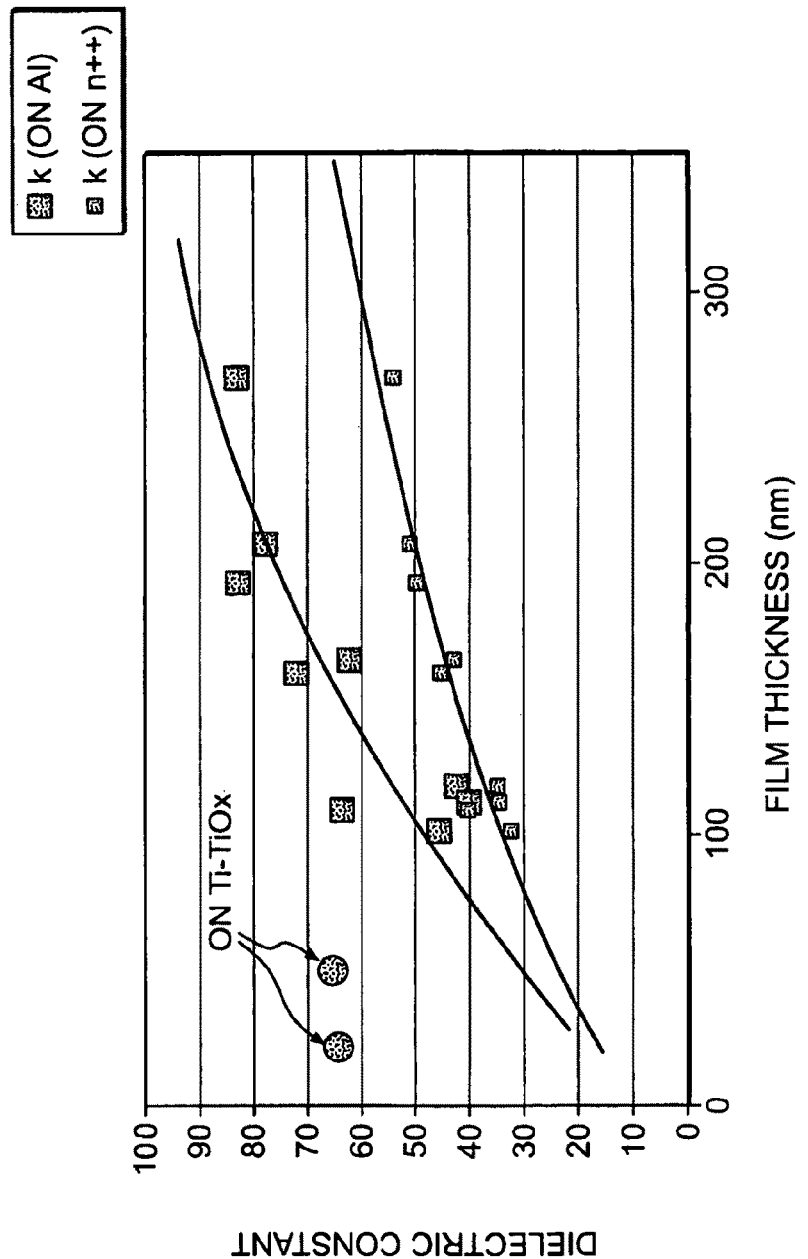
FIG. 8 illustrates data points from a bottom electrode that helps reduce or eliminate the roll-off illustrated in FIG. 7.

However, this roll-off effect can be greatly reduced or eliminated in certain embodiments of the present invention. FIG. 8 shows two additional data points shown as circles which represent the dielectric constant of thin $TiO_2$ layers for layer 104 with $Ti$—$Ti_4O_7$ deposited as layer 102 of FIG. 3B.

Example 3

Deposition of $TiO_2$ on Ti—$TiO_x$ (x<2) Film Stack

A layer of $TiO_2$ was deposited on a titanium coated substrate. About 2000 Å of Ti metal was deposited at 7 KW of PDC target power, with Ar flow of 100 sccm and bias power of 200 W. After Ti deposition, $TiO_2$ was deposited in the same chamber without oxide burn in. This process resulted in a Ti—$TiO_y$—$TiO_2$ (y<2) film stack. The k value of a 200 Å film was as high as 60.

Figure 9B:
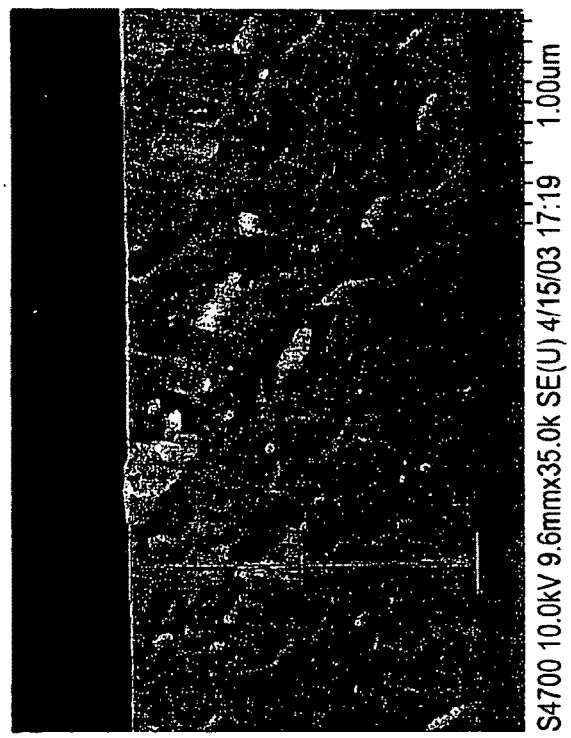
FIGS. 9A and 9B illustrate an SEM cross-section of a $Ti_4O_7$ target obtained from Ebonex™ and an SEM cross section of the $Ti_4O_{6.8}$ film deposited from the Ebonex™ target according to the present invention.
Figure 9A:
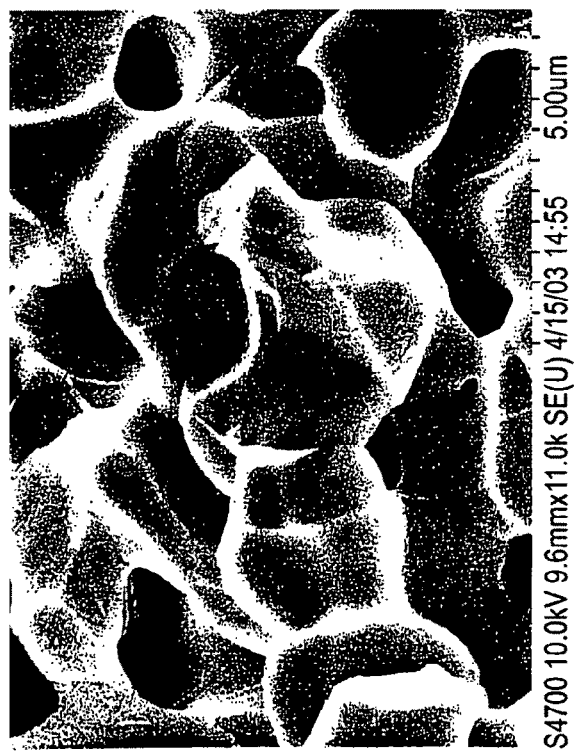

FIGS. 9A and 9B illustrate an SEM cross-section of a $Ti_4O_7$ Ebonex™ target (FIG. 9A) and an SEM cross section of the $Ti_4O_{6.8}$ layer (FIG. 9B) deposited from the Ebonex™ target according to the present invention. The deposited film shows smooth deposition of the layer. The Ebonex™ target shown in FIG. 9A shows an open porosity material with high roughness. The deposited layer shown in FIG. 9B, however, shows a highly dense layer with a smooth surface condition.

Table I shows the effects of the dielectric properties of $TiO_2$ deposited according the present invention in comparison with previously obtained values. The values for the previously obtained reactive sputtering was taken from the paper "Frequency-Dependent Pulsed Direct Current magnetron Sputtering of Titanium Oxide Films," by J. Y. Kim et al., J. Vac. Sci. Techn., A 19(2), March/April 2001. The values for PDC PVD with bias was experimentally obtained from layers deposited as described in Example 2 above.

TABLE I

| Process | $V_{bd}$ (Mv/cm) | K | FM |
|---|---|---|---|
| Reactive Sputtering | 0.46~1.35 | 34~65.9 | 19~50 |
| PDC physical Vapor Deposition with Bias | 3.48 | 83 | 288 |

As can be seen from Table I, the breakdown voltage $V_{bd}$ is significantly improved in layers according to the present invention. Further, the dielectric constant of the resulting layer is also higher. The figure of merit (FM) then for the deposited layer was 288, very much higher than that report by Kim et al. The reference Kim et al. was the reference reporting the best quality $TiO_2$ films available at the time of filing of the prior application to which this disclosure claims priority.

Figure 10:
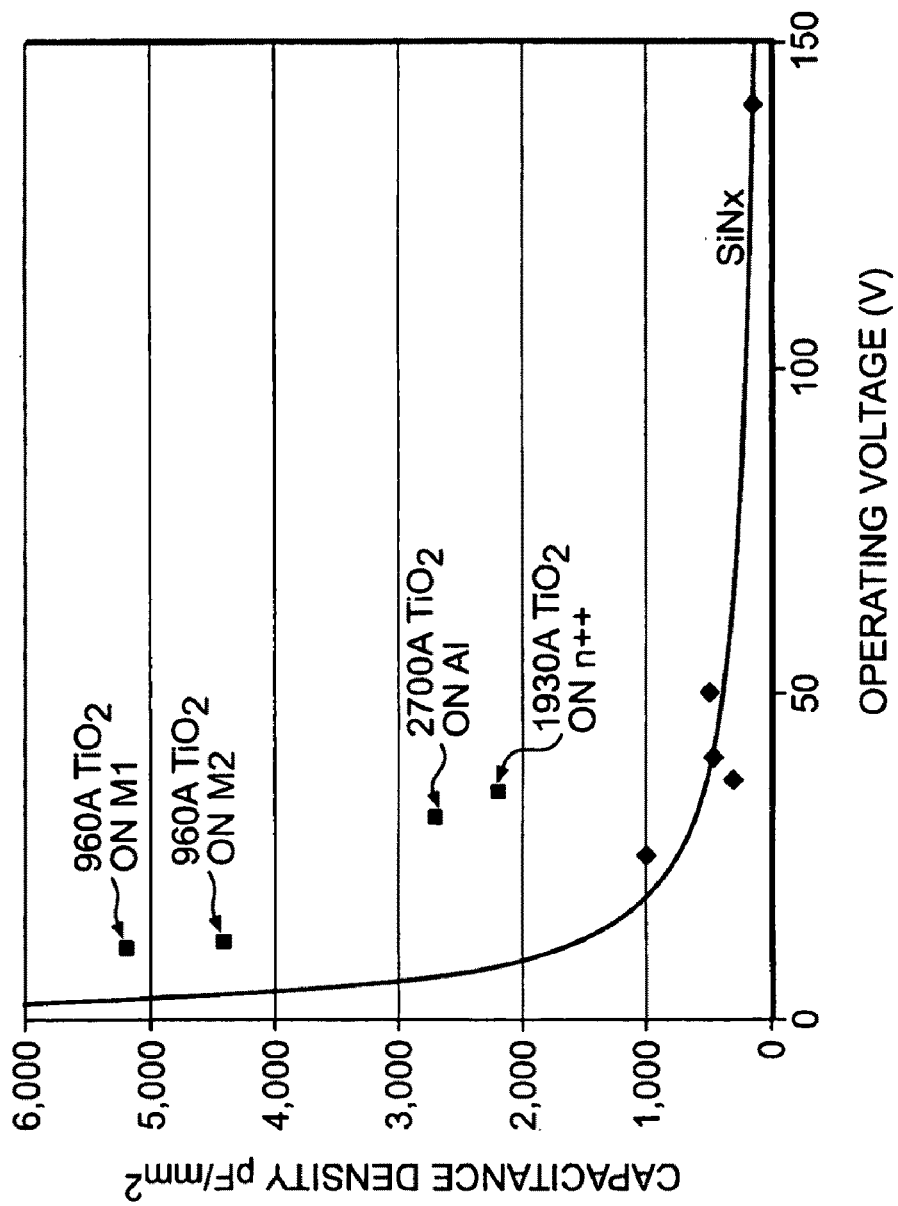
FIG. 10 shows the industry standard of thin-film capacitor performance in comparison with layers according to some embodiments of the present invention.

FIG. 10 shows data of capacitance made with layers according to the present invention in processes as described in Example 2 above are shown in comparison with available industry values. As is observed in FIG. 10, layers of $TiO_2$ deposited according to the present invention have higher dielectric breakdown voltages than other dielectric films utilized in industry, which is represented by the solid line. However, due to the roll-off in dielectric constant K in films below about 1000 Å in thickness (as is indicated in the top two points in FIG. 10), a capacitance density above about 5000 or 6000 pF/mm2 could not be achieved using thinner films. This is also shown in FIG. 7.

Figure 11:
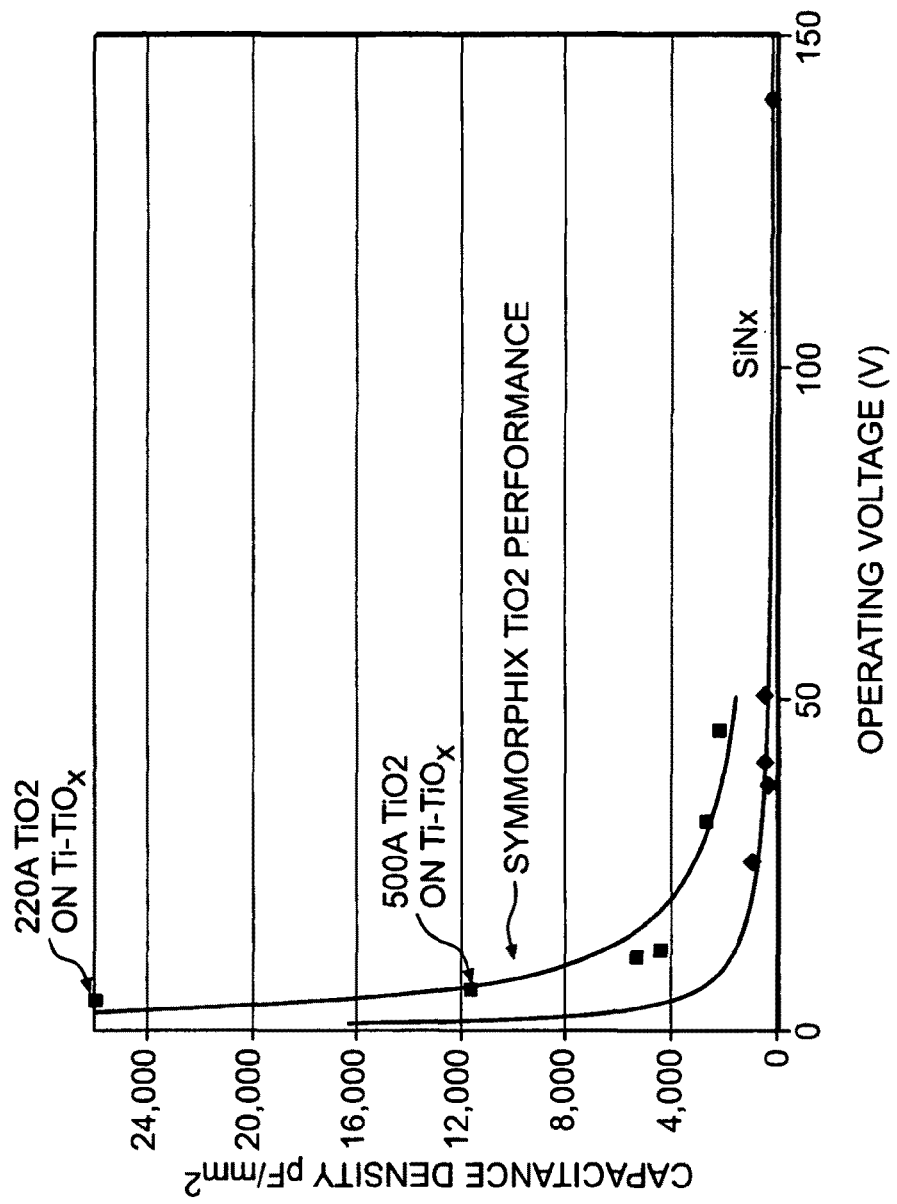
FIG. 11 shows the performance of various thin films deposited according to the present invention in a capacitor structure.

However, combined with the use of a conductive sub-oxide and the higher dielectric constant of thinner films as shown in FIG. 11, a capacitance density of 12000 pF/mm2 can be achieved with a 500 Å thickness film and a capacitance density of greater than 24000 pF/mm2 can be achieved with a 220 Å film, as is shown in FIG. 11. These film stacks were deposited as described in Example 3 above.

Figure 12:
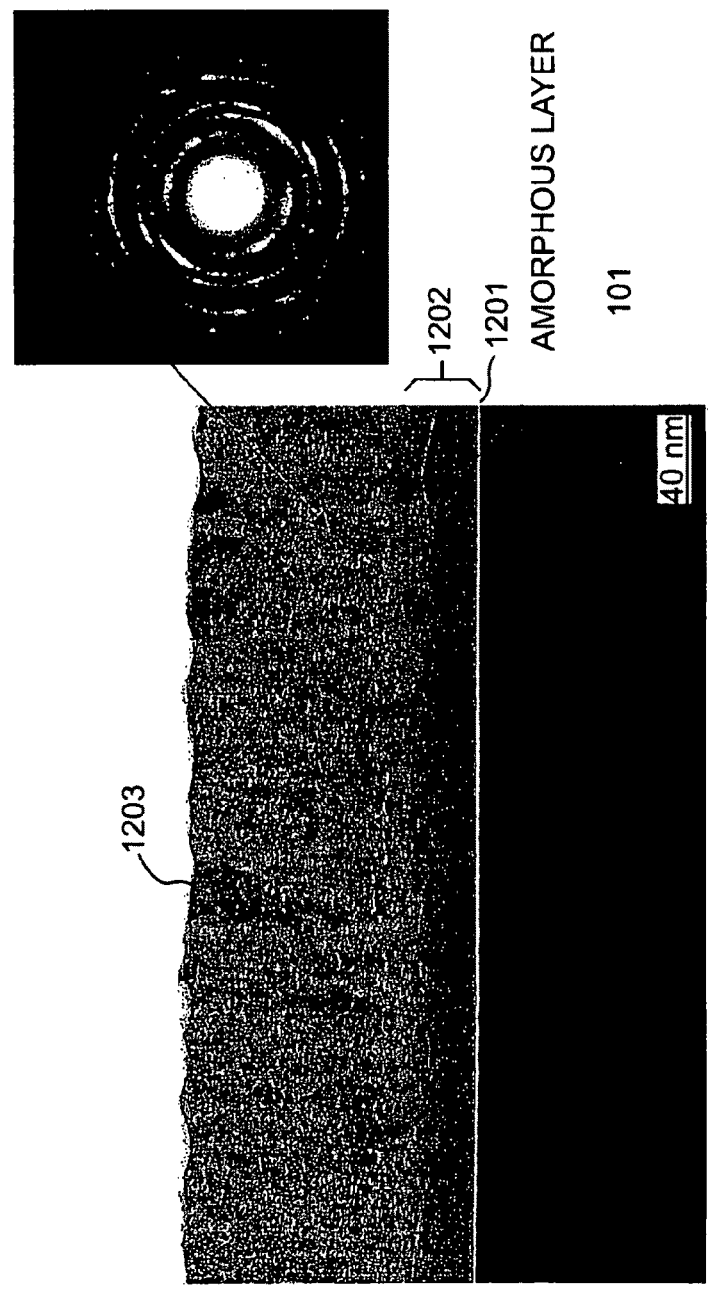
FIG. 12 shows a cross-section TEM and diffraction pattern amorphous and crystalline layers of $TiO_2$ on n++ wafers.

FIG. 12 shows a deposited layer 102 on a substrate 101 formed of n++ silicon wafer. Layer 102 is formed of $TiO_2$ deposited according to the present invention. As shown in the SEM cross-section, the $TiO_2$ layer shows several layers. A layer 1201 is formed of $SiO_2$ formed on substrate 101 and is formed about 20 Å thick. An amorphous layer 1202 of thickness about 250 Å is then formed above layer 1201. Finally, a crystalling $TiO_2$ layer 1203 is formed about 4000 Å thick. In some embodiments of the present invention, a continuous deposition on a substrate results in a first amorphous layer deposited at initially cooler temperature followed by a further crystalline layer deposited during the increased temperature of the process. A diffraction pattern inset in FIG. 12 illustrates the crystalline nature of layer 1203.

Table II tabulates data taken from a number of bi-layer film such as that shown in FIG. 12 and completely amorphous films formed by repeated initial deposition layers at cool deposition conditions. Films near 1000 Å of thickness are compared and display similar values for the dielectric constant. However, the amorphous film exhibits much higher dielectric breakdown strengths. Due to the similar thickness and values of the dielectric constant, the two films exhibit similar values for capacitance. However, the amorphous film illustrates superior breakdown voltage and therefore has a higher figure of merit (FM). These trends are more pronounced in the thicker films with thicknesses close to 2000 Å. In this case, the values of the dielectric constant and capacitance are nearly identical but again there is a significantly higher breakdown voltage in the amorphous film, which results in a significant improvement in the figure of merit for the amorphous films.

TABLE II

| Film Thickness (nm) | k | $V_{bd}$ (MV/cm) | FM | C (pF/mm2) | Breakdown Voltage (V) | Film Morphology |
|---|---|---|---|---|---|---|
| 969 | 63 | 3.6 | 227 | 540 | 348 | Bi-layer |
| 1036 | 62 | 6.4 | 396 | 538 | 660 | Amorphous |
| 2020 | 98 | 3.5 | 335 | 429 | 705 | Bi-Layer |
| 2322 | 98 | 5.5 | 539 | 429 | 1110 | Amorphous |

Therefore, it is clear that amorphous $TiO_2$ films have much better performance. As discussed above, those layers are the result of low temperature depositions. Therefore, as was demonstrated with the data shown in Table II, one method of producing thick amorphous $TiO_2$ layers is to simply utilize a sequence of low temperature depositions, halting the deposition prior to thermal heating of the depositing film. However, this method can take a significant amount of production time for thick films. Another embodiment of obtaining thick $TiO_2$ amorphous films is to apply active cooling to the substrate in an amount sufficient to provide continuously amorphous $TiO_2$ films.

Figure 13:
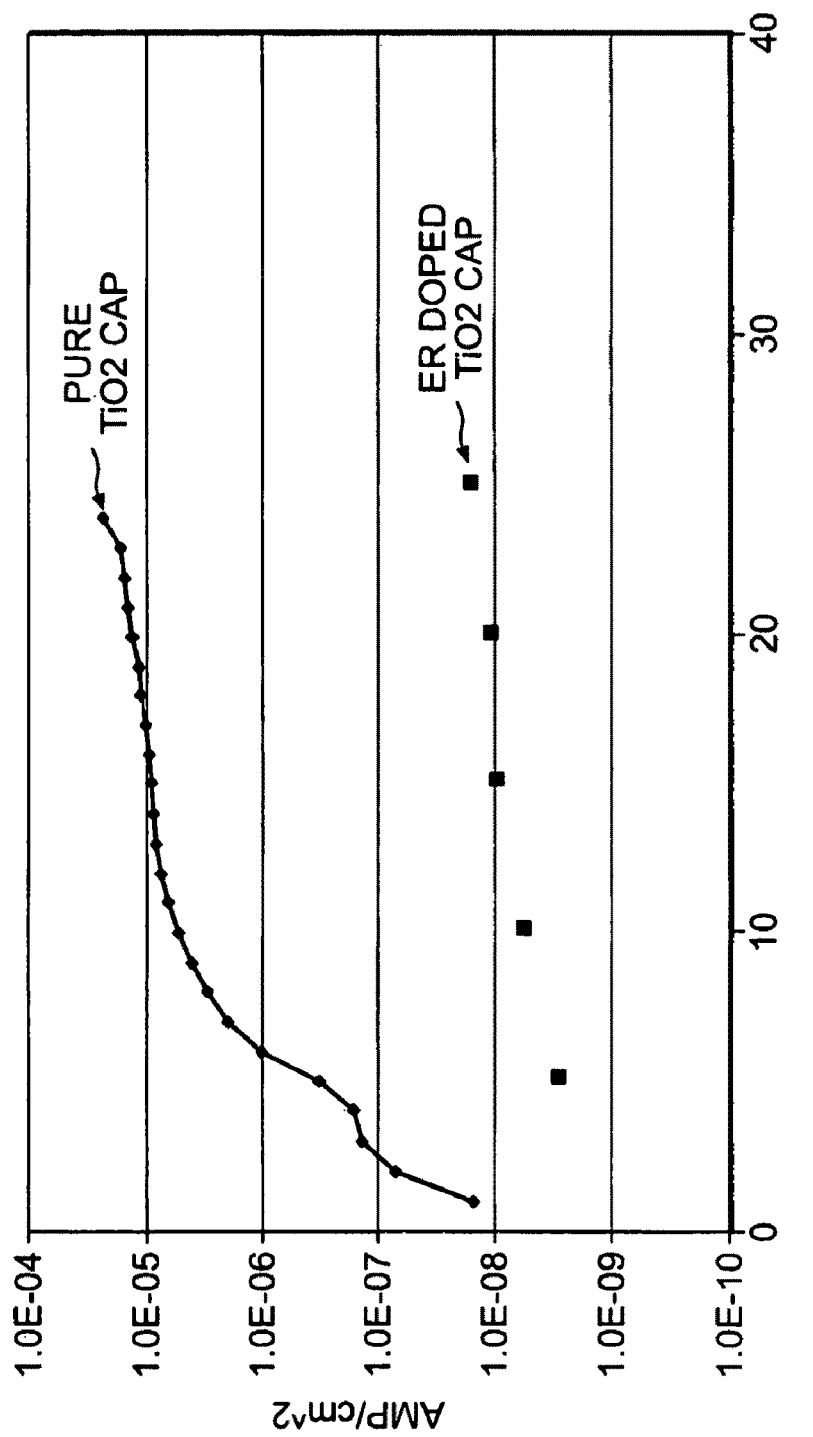
FIG. 13 shows a comparison of the leakage current for $TiO_2$ films according to embodiments of the present invention with and without erbium ion doping.

FIG. 13 shows a comparison of the leakage current for $TiO_2$ films according to embodiments of the present invention with and without erbium ion doping. The lower data points in FIG. 13 are from capacitors formed from films deposited from a 10 at. % Er doped TiO target. The target was electrically conductive. One example of the 10% doped film of 1000 Å thickness was formed with 60 sccm Ar, 6 sccm $O_2$, with a target power of 3 kW, bias power of 100 W, with a deposition time of 200 sec on a metal coated glass wafer. With the metal coating forming a copper titanium lower electrode and a titanium copper gold upper electrode patterned as 1×1 mm, discreet capacitors was then formed. The layers corresponding to the upper data points were deposited from a pure titanium target with no erbium doping on a TaN substrate with a evaporated platinum upper electrode. This structure of the bottom data is illustrated in FIG. 4B where, for example, layer 101 is a glass substrate, layer 103 is a copper titanium layer, layer 102 is the erbium doped $TiO_2$ layer, and layer 201 is a titanium copper gold layer.

As can be seen in FIG. 13, the leakage current density is reduced by many orders of magnitude by addition of erbium.

Figure 14A:
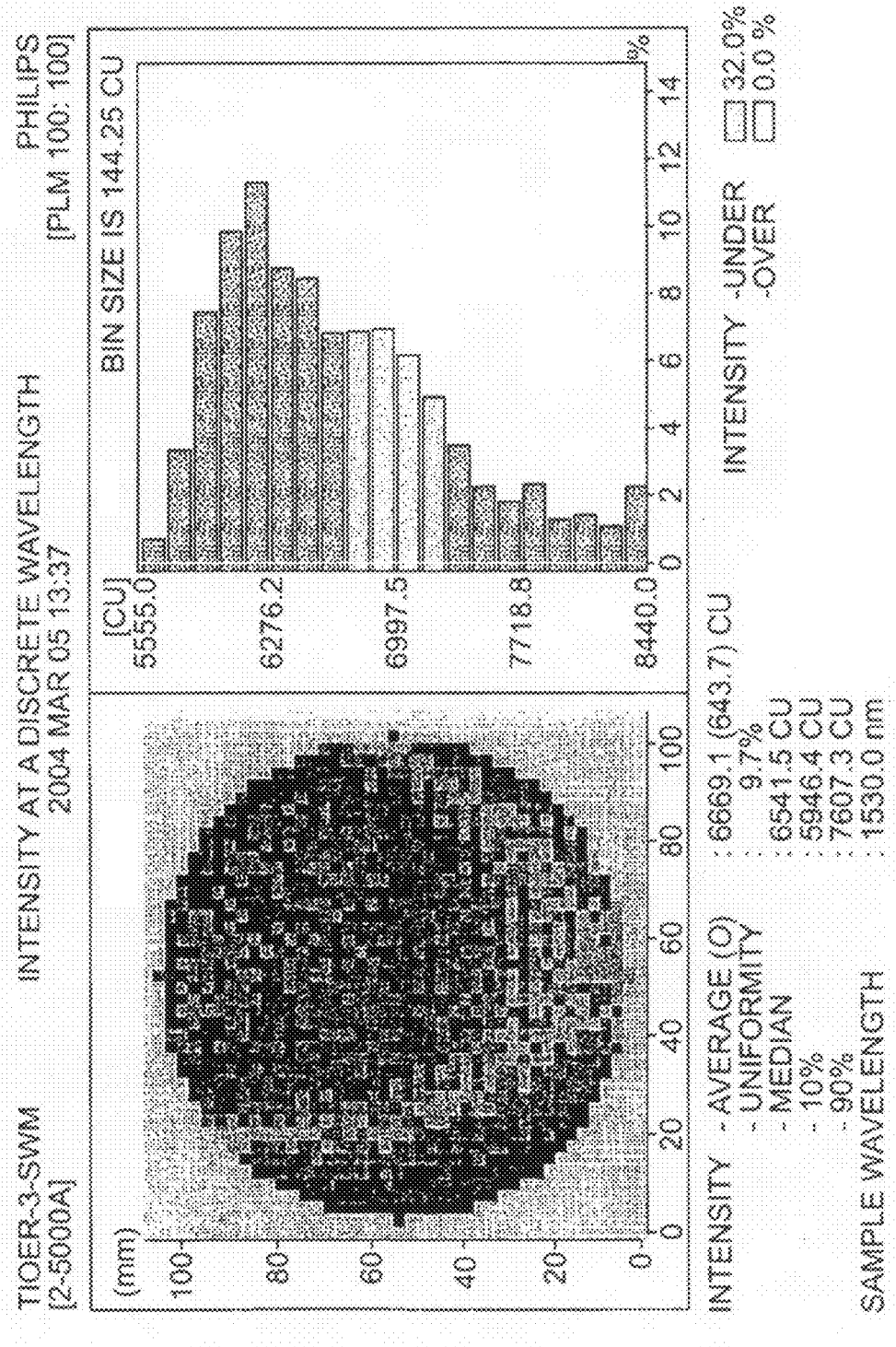
FIGS. 14A and 14B show a photoluminescence signal measured from a 5000 Å layer of 10% erbium containing $TiO_2$ deposited from a 10% erbium doped TiO conductive target and a photoluminescence signal measured from the same layer after a 30 minute 250° C. anneal.
Figure 14B:
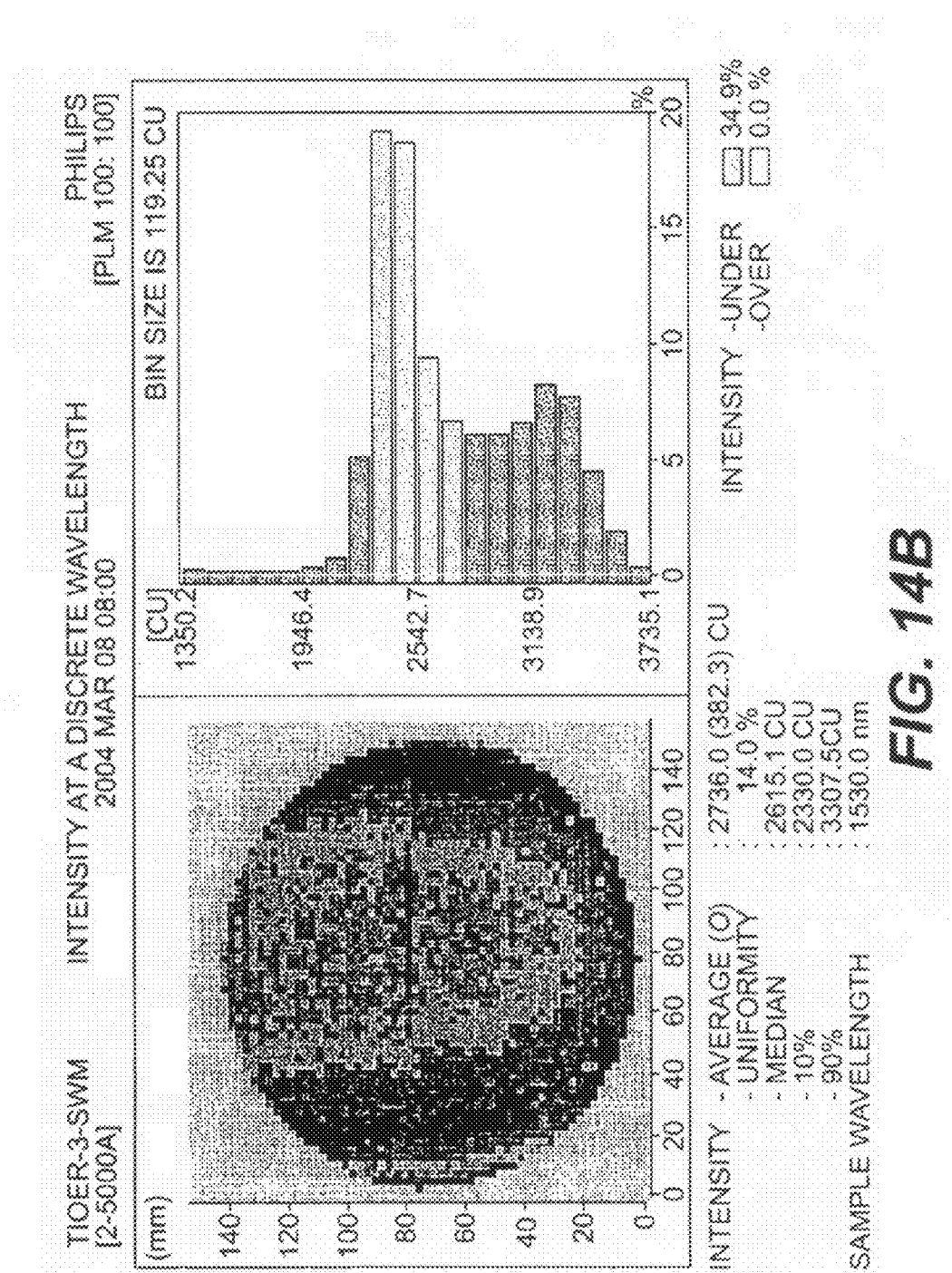

FIGS. 14A and 14B show a photoluminescence signal with excitation at 580 nm and measurement at 1.53 μm, measured from a 5000 Å layer of 10% erbium containing $TiO_2$ deposited from a 10% erbium doped TiO conductive target and a photoluminescence signal measured from the same layer after a 30 minute 250° C. anneal, respectively. Table III shows similar data for several layers deposited from the erbium-doped TiO conductive target.

TABLE III

| Thickness | Before Anneal | Anneal (° C.) | After Anneal |
|---|---|---|---|
| 5000 Å | 6704 | 150 | 5809 |
| 5000 Å | 6493 | 200 | 4042 |
| 5000 Å | 6669 | 250 | 2736 |
| 5000 Å | 6493 | 300 | 3983 |
| 1 μm | 6884 | 150 | 6743 |
| 1 μm | 5197 | 200 | 3685 |
| 1 μm | 6253 | 250 | 3612 |
| 1 μm | 5324 | 300 | 3381 |

According to some explanations of the reduction of leakage current in layers as illustrated by FIG. 13, fast electrons that have sufficient energy to excite the erbium ion would cause the rare earth ion to undergo excitation upon electron impact or passage within a distance sufficient for energy exchange. Consequently, the leakage current electrons capable of causing ionization within the dielectric oxide would be reduced by electron collisions with erbium ions. Excited state ions have at least two relaxation mechanisms for disposal of the energy: radiative and non-radiative. In radiative relaxation, the excited ion emits light. In non-radiative relaxation, the excited ion undergoes a cooperative process with vibrational modes of it's host dielectric oxide and produces a vibration which is the elemental form of heat. In the data illustrated in FIG. 13, it was not possible to observe light in the leakage test, but photoluminescence was observed from optical excitation of the similar 10% Er doped $TiO_2$ deposited from the 10% Er doped TiO conductive target, as shown in Table III.

As can be seen from the data in Table III, an erbium doped layer of titanium oxide was shown to fluoresce strongly under optical excitation by light of a wavelength 580 nm, using a Phillips PhotoLuminescence Microscope, model no. PLM-100. The target was electrically conductive and sputtered at a higher rate and a lower oxygen partial pressure than characteristic of a metallic titanium target. One example of the 10% doped film of 2,032 angstroms was 60 sccm Ar, 6 sccm $O_2$, with a target power of 3 kW, bias power of 100 W, with a deposition time of 300 sec.

The level of photoluminescence observed from the layer was similar to that obtained in as-deposited and annealed films providing commercial levels of optical absorption and fluorescence for applications to planar waveguide amplifiers having at least 15 dB gain for signals as weak as −40 dB at the 1.5 micron wavelength utilized for photonic C band communications.

Such a device can be illustrated with FIG. 3B, where layer 103 can be a conductive layer deposited on substrate 101, layer 102 can be a rare-earth doped $TiO_2$ layer deposited according to embodiments of the present invention, and layer 104 can be a further conductive layer or a conductive transparent layer to form an metal-insulating-metal (MIM) capacitor structure. Such a structure could function as a light emitting layer under either DC or AC electrical excitation. In another embodiment, layer 103 can be a lift-off layer such as $CaF_2$ or other organic material, layer 102 is the rare-earth doped $TiO_2$ layer, and layer 104 is absent, then upon lift-off or upon transfer of layer 102, a free standing or applied layer having electroluminescent or photoluminescent applications can be provided over a selected device.

Thin films according to the present invention can be utilized in advanced display devices, electrical energy storage and conversion, and to form optical and electronic films with scratch resistance and barrier properties. Advanced display product applications include OLED encapsulation, barriers for flexible polymer substrates, outcoupling mirrors and anti-reflection coatings, transparent conducting oxides, and semi-conducting materials for active matrix displays. Electrical energy storage and conversion applications include high density capacitor arrays for mobile communication devices, on-chip high "K" capacitors for advanced CMOS, and high voltage energy storage for portable power devices. Other applications include touch-sensitive devices and durable bar code scanners and see-through sensors as well as implantable biometric devices.

The embodiments described in this disclosure are examples only and are not intended to be limiting. Further, the present invention is not intended to be limited by any particular theory or explanation presented to explain experimental results. As such, examples of titanium oxide and titanium sub-oxide films illustrated herein and their applications are not intended to be limiting. One skilled in the art may contemplate further applications or films that are intended to be within the spirit and scope of the present invention. As such, the invention is limited only by the following claims.

We claim:

1. A titanium-based layer, comprising:
   titanium, the amount of titanium in the layer being represented by $Ti_x$, where x is between about 1 and about 4; and
   oxygen, the amount of oxygen in the layer being represented by $O_y$, where y is between about 1 and about 7, wherein:
   the titanium-based layer is densified, has a uniform thickness, is substantially free from columnar structures, and has a figure of merit, defined as the product of a dielectric constant of the titanium-based layer and a breakdown voltage of the titanium based layer, greater than 200 through a deposition process using a pulsed-DC power supply, an RF-bias to the substrate, and reactive ion sputtering on a substrate, wherein the pulsed-DC power supply is applied to a conductive ceramic target through a narrow-band rejection filter centered to remove power from the RF-bias such that the target voltage oscillates between positive and negative voltages.

2. The layer of claim 1, wherein the layer is $TiO_2$.

3. The layer of claim 2, wherein the layer is deposited between conducting layers to form a capacitor.

4. The layer of claim 2, wherein the layer includes at least one rare earth ion.

5. The layer of claim 4, wherein the layer is deposited between conducting layers to form a capacitor.

6. The layer of claim 4, wherein the at least one rare-earth ion includes erbium.

7. The layer of claim 4, wherein the layer is deposited between conducting layers to form a light-emitting device.

8. The layer of claim 4, wherein the layer is an optically active layer deposited on a light-emitting device.

9. The layer of claim 4, wherein the layer is an optically active layer applied to a light-emitting device.

10. The layer of claim 1, wherein the layer is sub-oxide of Titanium.

11. The layer of claim 10, wherein the layer is deposited between conducting layers to form a capacitor.

12. The layer of claim 10, wherein the layer includes at least one rare earth ion.

13. The layer of claim 12, wherein the layer is deposited between conducting layers to form a capacitor.

14. The layer of claim 12, wherein the at least one rare-earth ion includes erbium.

15. The layer of claim 12, wherein the layer is deposited between conducting layers to form a light-emitting device.

16. The layer of claim 12, wherein the layer is an optically active layer deposited on a light-emitting device.

17. The layer of claim 12, wherein the layer is an optically active layer applied to a light-emitting device.

18. The layer of claim 2, wherein the layer is a protective layer.

19. The layer of claim 18, wherein the protective layer is a catalytic layer.

20. The layer of claim 18, wherein the protective layer includes at least one rare-earth ion.

21. The layer of claim 1, further including depositing an $TiO_2$ layer on the layer wherein the layer and the $TiO_2$ layers are deposited between conducting layers to form a capacitor with decreased roll-off characteristics with decreasing thickness of the $TiO_2$ layer.

22. The layer of claim 1, wherein the layer includes at least one rare earth ion.

23. The layer of claim 22, wherein the at least one rare-earth ion includes erbium.

24. The layer of claim 22, wherein the layer is deposited between conducting layers to form a light-emitting device.

25. The layer of claim 22, wherein the layer is an optically active layer deposited on a light-emitting device.

26. The layer of claim 22, wherein the layer is an optically active layer applied to a light-emitting device.

27. The layer of claim 1, wherein the layer is a conducting oxide.

28. The layer of claim 27, wherein the substrate is a conducting electrode and the layer is a protective layer.

29. The layer of claim 28, wherein the protective layer is a catalytic layer.

30. The layer of claim 28, wherein the protective layer includes at least one rare-earth ion.

31. The layer of claim 27, wherein the substrate is a dielectric and the layer is a protective layer.

32. The layer of claim 31, wherein the protective layer is a catalytic layer.

33. The layer of claim 1, a temperature of the substrate is controlled during deposition.

34. The layer of claim 33, wherein the temperature is controlled using active temperature control.

35. The layer of claim 1, wherein the substrate includes a transistor structure.

36. The layer of claim 1, wherein the layer is an amorphous layer.

* * * * *